United States Patent [19]
Nagasaka

[11] Patent Number: 5,890,197
[45] Date of Patent: Mar. 30, 1999

[54] SEMICONDUCTOR MEMORY DEVICE HAVING SPLIT TRANSFER FUNCTION

[75] Inventor: Shigeki Nagasaka, Fuchu, Japan

[73] Assignee: Kabushiki Kaisha Toshiba, Tokyo, Japan

[21] Appl. No.: 989,789

[22] Filed: Dec. 12, 1997

Related U.S. Application Data

[62] Division of Ser. No. 405,497, Mar. 16, 1995, Pat. No. 5,748,201.

[30]    Foreign Application Priority Data

Mar. 16, 1994  [JP]  Japan .................................. 6-045585

[51] Int. Cl.[6] ...................................................... G06F 12/00
[52] U.S. Cl. ...................... 711/105; 711/154; 365/230.09
[58] Field of Search .............................. 365/230.09, 236, 365/238.5; 711/105, 109, 154, 207

[56]            References Cited

U.S. PATENT DOCUMENTS

| | | | |
|---|---|---|---|
| 5,001,672 | 3/1991 | Ebbers et al. | 365/230.05 |
| 5,062,078 | 10/1991 | Arakawa | 365/189.07 |
| 5,270,973 | 12/1993 | Guillemaud et al. | 365/189.02 |
| 5,307,323 | 4/1994 | Fukuda et al. | 365/230.05 |
| 5,379,263 | 1/1995 | Ogawa et al. | 365/230.04 |
| 5,469,400 | 11/1995 | Yamano | 365/230.01 |
| 5,481,671 | 1/1996 | Fujisaki | 395/182.06 |
| 5,579,275 | 11/1996 | Toda | 365/230.09 |
| 5,581,733 | 12/1996 | Toda | 711/165 |
| 5,687,351 | 11/1997 | Toda | 711/149 |
| 5,768,178 | 6/1998 | McLaury | 365/149 |
| 5,787,311 | 7/1998 | Waller | 395/869 |

FOREIGN PATENT DOCUMENTS 474366   3/1992   European Pat. Off. .
4298882  10/1992  Japan .

OTHER PUBLICATIONS

European Search Report, dated May 31, 1996, Appl. No. 95103850.4

Richard A. Quinnell, "Standardized feature sets add versatility and speed", Electrical Design News, 37 (1992) Mar. 16, No. 6, pp. 37–40.

European Search Report for Application No. 95103850.4, Publication No. 0 474 366 A3, Nov. 1992.

*Primary Examiner*—Tod R. Swann
*Assistant Examiner*—Christopher S. Chow
*Attorney, Agent, or Firm*—Loeb & Loeb LLP

[57]            ABSTRACT

A semiconductor memory device including a serial I/O buffer; DRAM cells; and SAM cells arranged in line, the SAM cells corresponding to the DRAM cells in one row. In the device in a first mode, the SAM cells are divided into N first portions each having boundaries, data stored in the SAM cells being transferred to the serial I/O buffer sequentially until the SAM cells in the boundaries of the first portions are transferred to the serial I/O buffer. In a second mode, the SAM cells are divided into M (N>M) second portions each having boundaries, data stored in the SAM cells being transferred to the serial I/O buffer sequentially until the SAM cells in the boundaries of the second portions are transferred to the serial input output buffer. The semiconductor-memory device further includes a circuit for detecting changes from the first mode to the second mode and from the second mode to the first mode. The semiconductor memory device further includes a circuit for generating first and second signals. When the mode is changed from the first mode to the second mode, the circuit generates the first signal. When the mode is changed from the second mode to the first mode the circuit generates the second signal.

8 Claims, 21 Drawing Sheets

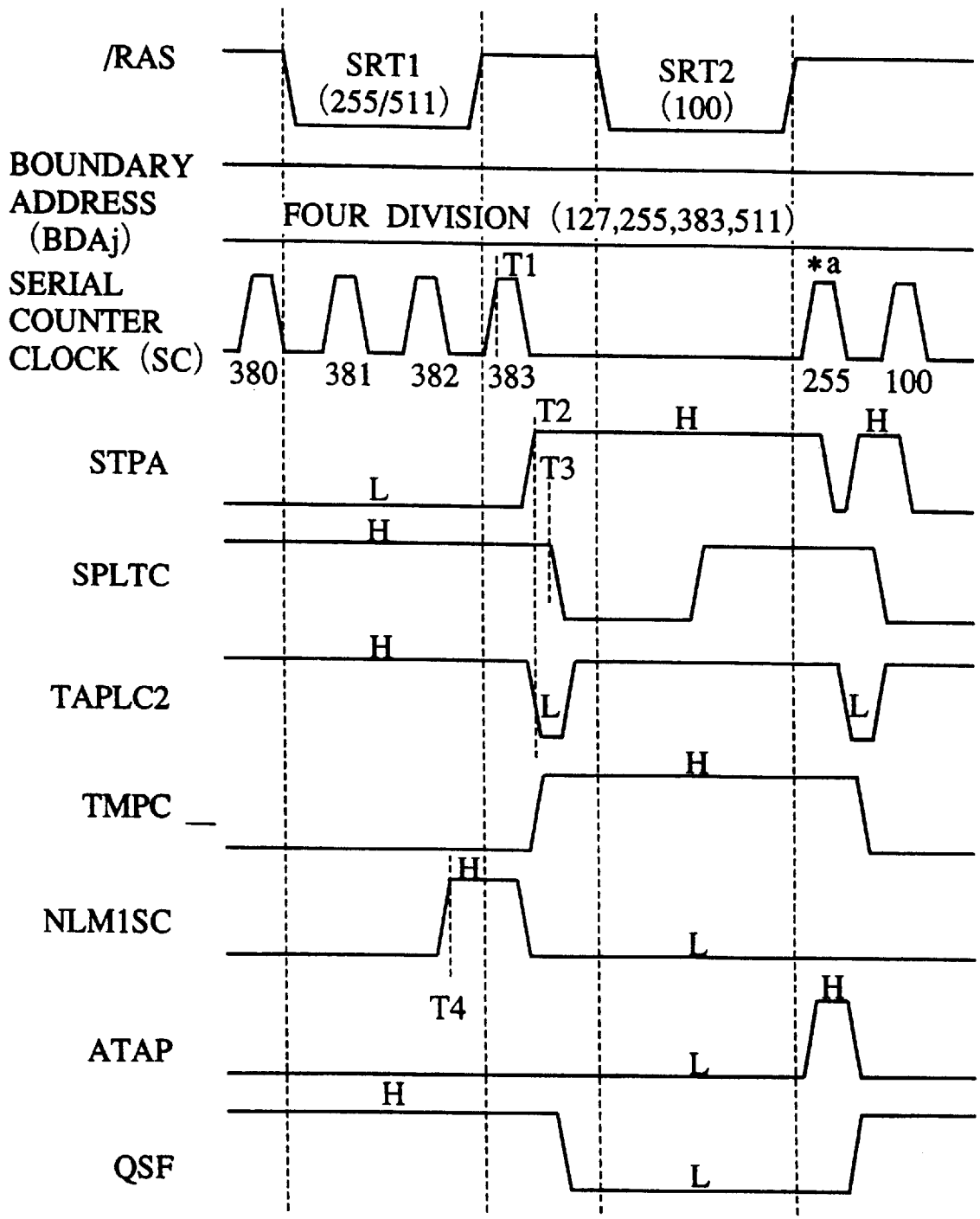

SAD33

SEMICONDUCTOR MEMORY DEVICE HAVING SPLIT TRANSFER FUNCTION

This is a division of application Ser. No. 08/405,497 filed Mar. 16, 1995, now U.S. Pat. No. 5,748,201 which, application is hereby incorporated by reference in its entirety.

BACKGROUND OF THE INVENTION

1. Field of the Invention

The present invention relates to a semiconductor memory device having a split transfer function, provided with a random access port and a serial access port, and, in particular, to a semiconductor memory device used for a high speed graphic memory.

2. Description of the Prior Art

It is well known that a dual-port semiconductor memory device having both a random access memory (RAM) and a serial access memory (SAM) is commonly used as a memory for graphics.

This type of a dual-port memory has, for example, a configuration such as that illustrated in FIG. 1.

FIG.1 is the configuration diagram of the dual-port semiconductor memory. In FIG. 1, data in the dynamic random access memory cells (512×512×4 random access memory cell array) are transferred to registers in an upper SAM or registers in a lower SAM through transfer gate. The data in the registers in the upper SAM and the lower SAM are selected by serial selectors 87 and transferred to an external device (not shown). An address to select one of the register in the upper SAM and the lower SAM by the serial selectors 87 is transferred from a serial address counter 80.

In normal usage, data stored in memory cells in a row in the RAM are transferred to registers in a SAM, and the data in the registers in the SAM are transferred serially to a display device (not shown) through a serial output buffer to display the data on a screen in the display device. A split transfer mode has been used in order to transmit the data in the memory cells in the row in the RAM to the registers in the SAM and to transfer the data to an external device through the serial output buffer, with good efficiency.

A split transfer under the split transfer mode is a mode in which memory cells in a row are divided into two parts and then data in the memory cells is transferred to the registers in two parts in the SAM alternately. In a normal readout transmission, synchronization of the timing of the data transfer from the RAM to the SAM and the timing of the input of a serial clock SC is very strict so that the data output from the SAM occurs without interruption because the next transfer data must be transferred to the registers in the SAM from the memory cells in a next row while an address pointer indicating a readout position in the registers in the SAM returns to a start address position in the registers of the SAM.

However, in the split transfer mode, by dividing the SAM into two parts (upper SAM and lower SAM), for example, there are no strict timing requirements and the output from the registers in the SAM can take place without interruption because data in the memory cells in the RAM are transferred to the upper SAM while data in the registers of the lower SAM are transferred to an external device (not shown).

The data readout from the registers of the SAM under the split transfer mode is initiated at the register addressed by a TOP Address Point ("TAP") which has been set in this split transfer cycle (SRT cycle) and the data readout is completed at the register indicated by a boundary address which has been previously set.

The registers in the SAM are divided into $2^n$ parts (where n=1, 2, 3, ...) by using boundary addresses so that the data read out from the registers in the SAM are efficiently displayed on the screen. In the case where the data readout from the registers in the SAM are in a continuous split transfer mode, a pointer indicating an address of the register in the SAM jumps to a register in the SAM as a next data readout position indicated by a next TAP address for a next split transfer after a pointer indicating the register in the SAM as a readout position reaches a boundary address of the current split transfer.

A control signal QSF, the SAM counter address, the boundary address, and the TAP address are used for pointing the address of a register in the SAM. The control signal QSF indicates one of the upper SAM and the lower SAM. For example, if the control signal QSF is at the high level, the upper SAM is selected, if at the low level, the lower SAM is selected.

The control method for a SAM counter address and the control signal QSF will now be described with reference to FIGS. 1 to 4.

FIG. 2 is a detailed configuration diagram mainly showing the serial address counter 80 in the dual-port semiconductor memory device shown in FIG. 1.

FIG. 3 is a timing chart to explain a relationship among main internal signals which are used to control an operation of a SAM counter address (SAi) 72 and a control signal QSF under a continuous split transfer mode.

FIG. 4 is a configuration diagram of a circuit used for controlling a conventional split transfer operation.

In order to simplify an explanation, the memory cells in the RAM which are the core section of the dual port semiconductor memory device shown in FIG. 1 are divided into two. Registers 512 addressed by the SAM addresses in the SAM including an upper SAM and a lower SAM have 512 bits (0 to 511). Boundary addresses are 127, 255, 383, and 511. In addition, a control signal SC(n) indicates the n-th register in the SAM, and a SRT(m) indicates a split transfer mode or cycle having a tap address of m. In the case shown in FIG. 3, the first split transfer SRT1 cycle has two tap addresses, 255 and 511 and the boundary addresses of 127, 255, 383, and 511 are set in a boundary address register 86 shown in FIGS. 1 and 2. The second split transfer mode has the TAP address of 100.

As shown in FIG. 1, a TAP address is transferred to a first internal address register 81 in the serial address counter 80 from a column address buffer (register) 71 of 9 bits through first transfer gate 810 while a column address strobe signal /CAS is at the low level.

Boundary addresses are transferred to a boundary address register 86 from a row address buffer (9 bits) 60 when a row address strobe signal /RAS is changed to the low level.

In FIG. 2, a TAP address for indicating the data in a register in a row of the RAM is latched into a first internal address register 81 in the serial address counter 80. When the TAP address latched into the first internal address register 81 is transferred to a second internal address register 82 when a SAM counter address (SAi) in the SAM counter address register 72 is agreed with a boundary address stored in the boundary address register 86 by a first comparator 84 in the QSF circuit 800. When agreed, the first comparator 84 generates an agreement signal (which are control signals TAPLC2 described later) and transmits the agreement signal TAPLC2 to the second transfer gate 820 located between the first internal address register 81 and the second internal address register 82. By receiving the agreement signal TAPLC2 from the first comparator 84, the second transfer gate 820 transfers the TAP address stored in the first internal address register 81 to the second internal address register 82.

The column address or the TAP address stored in the second internal address register 82 is transferred to the third internal address register in the third internal address register 83 when receiving a control signal FSCT. This control signal FSCT is generated by the first comparator 84 when a first serial clock SC is received after the SAM counter address SAi is agreed with the boundary address BDAi.

Then, the TAP address stored in the third internal address register in the third internal address register 83 is transferred to the SAM counter address register 72.

A control signal QSF is generated by a QSF generator in a second comparator 85 in the QSF circuit 800 as a result of comparing the SAM counter address SAi in the SAM counter address register 72, the boundary address stored in the boundary address register 86, and an address stored in the first internal address register 81. The control signal QSF switches a SAM switch in order to select one of the upper SAM and the lower SAM to transfer data in the registers in the upper SAM or the lower SAM to an external device.

Data in the registers in the upper SAM are transferred to the external device while the control signal QSF is at the high level and data in the registers in the lower SAM are transferred to the external device when the control signal QSF is at the low level.

In controlling the SAM counter address in the SAM counter address register 72, with a SAM counter address (SAi) is incremented by "1" such as SAi=(SAi +1) according to receive the serial clock SC under the normal operation mode, not under the split transfer mode.

In the normal operation mode, the SAM counter address is returned to zero "0" when the SAM counter address is reached to "511" (or to the 511-th registers).

In addition, in the split transfer mode, the value of the SAM counter address (SAi) is changed by receiving a next TAP address which has been set when the SAM counter address (SAi) points to the register in the SAM addressed by the boundary address.

In the timing chart as shown in FIG. 3, when a following serial clock SC (383) is received at the timing T1 by the first comparator 84 (which is also transferred to the SAM counter address register 72 at the same time) in the split transfer SRT1 cycle (TAP addresses are 255 and 511), the first comparator 84 compares a boundary address (BDAj=383) stored in the boundary address register 86 with the SAM counter address (SAi=383) in the SAM counter address register 72, then shows agreement of them, the first comparator 84 generates a control signal STPA of the high level at the timing T2 shown in FIG. 3 and FIG. 4A. The control signal STPA changes to the high level when the serial clock SC is agreed with the boundary address compared by the first comparator 84.

A control signal SPLTC indicates the split transfer mode with the high level. A control pulse signal TAPLC2 of the low level is generated when the control signal STPA changes to the high level and the control signal SPLTC is at the high level at the timing T2 (shown in FIG. 3 and FIG. 4A). When the pulse signal TAPLC2 of the low level is generated at the timing T2, a TAP address (255) stored in the first internal address register 81 is transferred to the second internal address register 82.

FIG. 4A shows a configuration diagram of the first comparator for the control signals STPA and TAPLC2. Thus, the control pulse signal TAPLC2 is generated when the serial clock SC is agreed with the boundary address.

Then, a following serial clock SC is received by the SAM counter address (SAi) register 72 and the first comparator 84. The first comparator 84 generates and transmits the first serial clock SC acknowledge control signal FSCT of the high level to the third transfer register 830. By this, the TAP address (255) stored in the second internal address register 82 is transferred to the third internal address register 83, then, the TAP address is set to the SAM counter address register 72 as a new SAM counter address.

The value of the control signal QSF is changed by using the control signals NLM1SC and the ATAP signals. The control signal ATAP is changed to the high level when the value of the SAM counter address register 72 is agreed with the boundary address stored in the boundary address register 86.

The control signal NLM1SC is used for a WRAP AROUND mode which is the normal operation mode, not under the split transfer mode. The control signal NLM1SC is changed from the low level to the high level when the SAM counter address (SAi) 72 is agreed with the boundary address–1. By using the control signal NLM1SC, the control signal QSF is changed within two cycles.

It requires more than two cycles to change the control signal QSF after the first comparator 84 decides that the serial clock SC is agreed with the boundary address stored in the boundary address register 86.

The control signal NLM1SC is changed to the high level when the serial clock SC is equal to the cycle of the boundary address–1, for example at the timing T4 shown in FIG. 3. In this case, data in the memory cells in the upper RAM or the lower RAM are latched into the registers in one of the upper SAM and the lower SAM indicated by the control signal QSF. The data stored in the registers in the SAM are transferred to an external device (not shown) from the SC cycle in which the serial clock SC is agreed with the boundary address.

On the contrary when a first serial clock 1st-SC after the boundary address is agreed with the address stored in the SAM counter address register 72 is received at the first comparator 84 after the SRT2 cycle, this 1st-SC is the first SC for the first split transfer SRT1 cycle and this serial clock SC (255) is equal to the boundary address for the next split transmission SRT2 cycle. Accordingly, the value of the control signal QSF must be changed and a next TAP address (100) for the next split transfer SRT2 cycle must be set into the third internal address register 83. In this case, there is no serial clock SC which is a boundary address–1. In other words, the control signal NLM1SC has no high level pulse after the SRT2 (100) cycle. This is a problem. In order to avoid this problem, a control signal ATAP is used in the conventional dual-port semiconductor memory device.

The control signal ATAP is generated by the circuit shown in FIG. 4B.

This control signal ATAP changes to the high level and latched by a latch circuit 400 shown in FIG. 4B only when the TAP address is agreed with the boundary address, for example at the timing T2 shown in FIG. 3. This control signal ATAP is used like the control signal NLM1SC under the wrap around operation mode which has already been described in brief. In other words, the level of the control signal QSF is changed when a following serial clock SC is received while the control signal ATAP is at the high level.

FIG. 4B shows a configuration diagram of the generation circuit for the control signals ATAP, SQXF, and QSF.

We use following three modes or cycles (1) to (3) for readout data from the conventional dual-port semiconductor memory device.

(1) CBRS mode is a /CAS before /RAS refresh stop register set mode. A boundary address can be changed in the CBRS mode.

(2) SRT mode is a split transfer mode (SRT mode) which has been described above.

(3) CBR mode is a /CAS before /RAS refresh option reset mode (CBR mode). In the CBR mode, registers in a SAM are divided into two SAM, each of which is a same memory size and a boundary address is reset for the two SAM. For example, a SAM address is 0 to 511, the address of the registers in the first SAM is 0 to 255, and the address of the registers in the second SAM is 256 to 511. In the CBR mode, the addresses 255 and 511 are set as the boundary addresses.

With this type of a conventional memory, irregularities are produced in one part of the composite modes CBRS (/CAS before /RAS refresh stop register set), SRT (split transfer), and CBR (/CAS before /RAS refresh option reset).

Three of these irregular modes are given below and these problem areas are explained.

First, FIG. 5 is a timing chart for a conventional first SAM composite mode (example 1).

In FIG. 5, boundary addresses can be changed only in the CBRS and CBR cycles. In the case of the CBRS cycle a new boundary address is effective following to the split transfer SRT cycle after the CBRS cycle. For this reason, the internal boundary address is changed with a new boundary address after a falling edge (at timing T50) of the row address strobe /RAS for the SRT2 cycle in the example 1 shown in FIG. 5.

As shown in FIG. 5, the boundary addresses are 255, 511 (two division) in the SRT1 cycle. Following the CBRS cycle, the boundary addresses are changed to new boundary addresses, 127, 255, 383, and 511 (four division) at the timing T50 after the SRT2 cycle. Thus, the boundary addresses are changed only after the CBRS cycle and the CBR cycle.

After the boundary addresses are changed in the SRT2 cycle at the timing T50, a comparison operation is made of the SAM counter address (127) stored in the SAM counter address register 72 and the new boundary addresses (127, 255, 383, 5111) stored in the boundary address register 86 by the first comparator 84.

The serial clock SC(127) is received at the timing T51 and set into the SAM counter address register 72. This SC (127 designated by the character reference "*b") is equal to one of the new boundary addresses(127, 255, 383, and 511) of the four division by comparing at the timing T50 before receiving the next serial clock SC(383) at the timing T52 designated by the character reference "*c". Thus, the control signal STPA changes to the high level at the timing T50 shown in FIG. 5.

At the timing T50, the conventional dual-port semiconductor memory is in the split transfer mode because the control signal SPLTC is at the high level, so that the pulse of the low level of the control signal TAPLC2 is generated (designated by "*h" shown in FIG. 5), because the serial clock (127) is equal to one of the boundary addresses (127, 255, 383, and 511 in the four division). Then, the TAP address (383) of the SRT1 cycle is transferred into the SAM counter address register 72 at the timing T52. An erroneous operation is occurred for the SAM counter address register 72.

On the other hand, in the WRAP AROUND mode which is not a split transfer mode, the SAM counter address (SAi) in the SAM counter address register 72 must be "128" by receiving the first serial clock SC immediately after the SRT2 cycle at which TAP addresses 127 and 383 are set into the SAM counter address register 72.

However, the TAP address (383) set in the SRT1 cycle is set into the SAM counter address register 72 because the SRT2 cycle is occurred after the CBRS cycle (the four division). An erroneous operation is occurred for the SAM counter address register 72.

The combination mode (CBRS cycle and SRT2 cycle) represents the conditions under which this type of erroneous operation is produced because the number of boundary addresses is increased. In other words, the erroneous operation will be happened in the case where the boundary addresses are not equal to the SAM counter address in the SAM counter address register 72 before the boundary addresses are changed at the timing T50 and one of the boundary addresses is equal to the SAM counter address in the SAM counter address register 72 after the boundary addresses are changed at the timing T50.

This type of error or restriction is produced because the control signal STPA is changed to the high level by the result of the comparing operation between the SAM counter address and the new boundary address at the timing T50 after the boundary address change in the SRT2 cycle after the CBRS cycle.

Next, FIG. 6 is a timing chart for a second conventional SAM composite mode (Example 2).

In the example 2 shown in FIG. 6, boundary addresses are 127, 255, 383, and 511 (in four division) during the SRT1 cycle. At the timing T60 after the SRT1 cycle (shown as "*d" in FIG. 6), the control signal QSF is changed from the low level to the high level by receiving the serial clock SC(127) because the serial clock SC (127) is equal to the boundary address (127).

Subsequently, a dummy SRT (DSRT) cycle in which the serial clock SC is not received, a CBRS cycle (two division), and a SRT2 cycle are executed.

At the timing T65, the new TAP address (383) is set into the SAM counter address register 72 by the low level pulse of the control signal TAPLC2. This TAP address (383) is equal to the boundary address at the timing T61, so that the control signal ATAP is changed to the high level and latched by the latch circuit 400, as shown in FIG. 4B.

In this case, the control signal ATPA is changed to the high level from the low level at the timing T61 in the Dummy SRT cycle (DSRT cycle) before changing to new boundary addresses (255/511) of the two division by the CBRS cycle.

However, by the execution of the CBRS cycle prior to the SRT2(127/383) cycle the serial clock SC(383) (or the TAP address(383)) is no longer the boundary address after the boundary address are changed to the new boundary addresses (255 and 511) at the timing T63, therefore the control signal ATAP must be changed to the low level at the timing T63. However, the signal ATAP is latched by the latch circuit 400 shown in FIG. 4B and this latch is released only by entering a following serial clock SC (383) at the timing T62. As shown in FIG. 4B, the control signal TMPC is at the high level while a next serial clock SC is received after the completion of the split transmission mode.

Accordingly, even if the boundary address is changed at the timing T63 in this case, the signal ATAP of the high level is latched from the timing T61 to the timing T62 because a next serial clock SC is not received before the timing T62. For this reason, the control signal QSF produces an erroneous operation at the timing T64 immediately after the receiving of the first serial clock SC (383) designated by the character reference "*e" at the timing T62. The level of the control signal QSF is changed to the low level at the timing T64. This is a problem. The control signal QSF must not be changed to the low level at the timing T64.

As the conditions under which this type of erroneous operation is produced, the case occurs wherein the modes DSRT+CBRS+SRT are executed in the time interval following the change in the control signal QSF to the high level at the timing T10 until the first serial clock SC (383) at the timing T60, the number of the boundary addresses is changed into a rough division (from the four division (127, 255, 383, and 511) to the two division (255, 511) by the CBRS cycle and it is considered that the TAP address is equal to the boundary address prior to the CBRS cycle, and the TAP address is not equal to the boundary address after the CBRS cycle.

This type of restriction is produced because a pulse is generated in a control signal TAPLC1 by entering the DSRT cycle and it is not possible to hold the TAP address for the SRT1 cycle because the TAP address for the dummy SRT cycle is superscribed in the SAM counter address register 72 in which the data which is to be compared with the boundary is stored. In addition to this a boundary address change is produced, and even though there is no necessity for the signal QSF to be changed, there is no function for releasing the latching of the control signal ATAP in this conventional dual-port semiconductor memory configuration shown in FIGS. 1, 2, 4A, and 4B.

Finally, FIG. 7 is a timing chart for a third conventional SAM composite mode (Example 3).

In the Example 3 shown in FIG. 7, the boundary addresses for the SRT1 cycle are 127, 255, 383, and 511 which are stored in the boundary address register 86. The level of the control signal QSF is changed to the high level from the low level at the timing T70 after the serial clock SC(127) shown as "*f" in FIG. 7 is received, because the SAM counter address (127) in the SAM counter address register 72 is equal to the boundary address (127). Subsequently, the SRT2 cycle and the CBR cycle follow. In the case of the CBR cycle, the boundary addresses (127, 255, 383, and 511 for the four division) are changed to new boundary addresses (255 and 511 for the two division) at the timing T71 immediately following the CBR cycle.

In the conventional SAM composite mode (Example 3), like the second composite mode (Example 2) shown in FIG. 6, a new TAP address is set into the SAM counter address register 72 because the low pulse of the control signal TAPLC2 is generated at the timing T75. After the level of the control signal QSF is changed to the high level at the timing T70 and before the change of the boundary addresses at the timing T71, the TAP address (383) in the SAM counter address register 72 is equal to the boundary address (383). By this, the level of the control signal ATAP is changed to the high level at the timing T72.

However, the serial clock SC(383) designated by the reference character "*g" is not equal to the boundary address after the boundary addresses are changed at the timing T71 in the CBR cycle, therefore the control signal ATAP must be changed to the low level. However, this control signal ATAP is latched by the latch circuit 400 shown in FIG. 4B and this latch can be released by using the control signal TMPC generated only by receiving a next serial clock SC.

Accordingly, even if the boundary address is changed in the CBR cycle, the next serial clock (383) designated by the reference "*g" is not received before the timing T73, so that the erroneous of the control signal QSF is occurred at the timing T74 at which the first serial clock SC (383) is received. At the timing T74, the level of the control signal QSF must not be changed to the low level.

As the conditions under which this type of erroneous operation is occurred, the case occurs wherein the SRT cycle and CBR cycle are executed after the level of the control signal QSF is changed to the high level at the timing T70 and before the first serial clock CK (383) is received at the timing T73. It is recognized that the TAP address (383) is equal to the boundary address (383) prior to the execution of the CBR cycle or before the timing T71. In addition, the TAP address (383) is not equal to the new boundary addresses (255/511) after the timing T71 in the CBR cycle.

As in the case of the Example 2 shown in FIG. 6, this type of restriction occurs because a pulse is generated in the control signal TAPLC1 at the timing T72 by the SRT2 cycle and it is not possible to store the TAP address for the SRT1 cycle because the TAP address for the SRT2 cycle is superscribed in the SAM counter address register 72 in which the data to be compared with the boundary addresses is stored. In addition to this a boundary address change is occurred, and even though there is no necessity for the control signal QSF to be changed at the timing T74, there is no function for releasing the latching of the control signal ATAP in the dual-port memory having this conventional configuration.

As can be understood from the foregoing explanation for the conventional dual-port memory, in a conventional dual-port semiconductor memory device provided with a split transfer function, erroneous operation is produced from the selecting of the upper SAM and the lower SAM in the SAM in a composite mode made up of the above-described split transfer mode, CBRS mode, and CBR mode.

SUMMARY OF THE INVENTION

Accordingly, an object of the present invention is, with due consideration to the drawbacks of such conventional dual-port semiconductor memory devices, to provide a dual-port semiconductor memory device wherein the selection of SAM parts in a SAM is reliably controlled in a composite mode made up of the split transfer SRT mode, the CBRS mode, and the CBR mode.

As a preferred embodiment of the present invention, a semiconductor memory device includes: a serial input output buffer; a RAM cell array having a plurality of DRAM cells arranged in matrix; and a SAM cell array having a plurality of SAM cells arranged in line, the SAM cells corresponding to the DRAM cells in one row; wherein: in a first mode, the SAM cell array is divided into N first portions each having boundaries, data stored in the SAM cells being transferred to the serial input output buffer sequentially until the SAM cells in the boundaries of the first portions are transferred to the serial input output buffer; and in a second mode, the SAM cell array is divided into M (N>M, where N,M are positive integers) second portions each having boundaries, data stored in the SAM cells being transferred to the serial input output buffer sequentially until the SAM cells in the boundaries of the second portions are transferred to the serial input output buffer;

characterized in that:
the semiconductor memory device further comprises a means for detecting changes from the first mode to the second mode and from the second mode to the first mode.

The semiconductor memory device described above, further comprises a means for generating a first and a second signals, wherein when a mode is changed from the first mode to the second mode, the means generates the first signal, and when the mode is changed from the second mode to the first mode the means generates the second signal.

In the semiconductor memory device described above, when a mode is changed from the first mode to the second mode, the data stored in the SAM cells are transferred continuously to the serial input output buffer in spite of the SAM cells in the boundaries of the first portions.

As another preferred embodiment of the present invention, a semiconductor memory device includes: a serial input output buffer; a RAM cell array having a plurality of DRAM cells arranged in matrix; and a SAM cell array having a plurality of SAM cells arranged in line, the SAM cells corresponding to the DRAM cells in one row, wherein: the SAM cell array is divided into a plurality of portions each having boundaries, data stored in the SAM cells being transferred to the serial input output buffer sequentially until the SAM cells in the boundaries are transferred to the serial input output buffer, and a division of the SAM cell array being changed in response to externally supplied signals, characterized in that:

the semiconductor memory device further comprises a means for detecting a changes of the division of the SAM cell array.

The semiconductor memory device described above, further comprises a means for generating a first and a second signals, wherein when the division of the SAM cell array is increased the means generates the first signal, and when the division of the SAM cell array is decreased the means generates the second signal.

In the semiconductor memory device described above, when the means generates the second signal, the data stored in the SAM cells are transferred continuously to the serial input output buffer in spite of the SAM cells in the boundaries of the previous division.

As another preferred embodiment of the present invention, a method for controlling a semiconductor memory device includes: a serial input output buffer; a RAM cell array having a plurality of DRAM cells arranged in matrix; and a SAM cell array having a plurality of SAM cells arranged in line, the SAM cells corresponding to the DRAM cells in one row, wherein: the SAM cell array is divided into a plurality of portions each having boundaries, data stored in the SAM cells being transferred to the serial input output buffer sequentially until the SAM cells in the boundaries are transferred to the serial input output buffer, and a division of the SAM cell array being changed in response to externally supplied signals, the method comprising:

(a) in a first mode,
dividing the SAM cell array into N of the portions; and
continuously transferring data from the SAM cells in the SAM cell array while comparing a first address of the SAM cells from which data is transferred and a second address of the SAM cells at the boundaries;

(b) in a second mode,
dividing the SAM cell array into M (N>M, where N and M are positive integers) of the portions; and
continuously transferring data from the SAM cells in the SAM cell array while comparing the first address and the second address; and (c) when a mode changes from the first mode to the second mode,
continuously transferring data from the SAM cells without comparing the first address and the second address.

As another preferred embodiment of the present invention, a semiconductor memory device with a function of a split read/write transfer by which data stored in memory cells in a row being divided into two parts and then transferred alternately, comprises:

a memory cell array having a plurality of dynamic random access memory cells arranged in matrix, the dynamic random access memory cells being divided into a first memory cell part and a second memory cell part;

a serial data register comprising a plurality of registers divided into a first serial data register and a second serial data register, the first serial data register for storing one half of data stored in the memory cells in a row, the second serial data register for storing other half of data stored in the memory cells in the row, and a serial data stream of continuous serial data being transferred between the plurality of dynamic random access memory cells and the serial data register;

a serial selector comprising a first serial selector and a second serial selector, the first serial selector being connected to the first serial data register, the second serial selector being connected to the second serial data register, the first serial selector and the second serial selector for selecting the register in the first serial data register and the second serial data register;

a boundary address register for storing a boundary address;

a first control circuit for receiving the boundary address from the boundary address register, comparing a new boundary address and an old boundary address which being previously stored in the boundary address register, generating a first level of a first control signal when the new boundary address being different from the old boundary address;

a counter comprising a first counter register, a second counter register, and a third counter register, the first counter register receiving a TAP address and storing the TAP address, the second counter register receiving the TAP address from the first counter register and storing the TAP address, and the third counter register receiving the TAP address from the second counter register and generating a current address obtained by incrementing the TAP address when receiving a serial clock and transferring the current address to the serial selector;

a second control circuit for comparing the current address stored in the third counter register with the boundary address stored in the boundary address register only when not receiving the first level of the first control signal,
generating a first level of a second control signal when the current address stored in the third counter register being agree with the boundary address stored in the boundary address register, and
generating a first level of a third control signal when the third counter register receives a first serial clock after the current address stored in the third counter register being agree with the boundary address during the split read/write transfer; and a third control circuit for comparing the TAP address stored in the first counter register with the boundary address, and generating a fourth control signal for selecting one of the first serial data register and the second serial data register alternately when the TAP address stored in the first counter register being agreed with the boundary address stored in the boundary address register, wherein the second counter register receives the TAP address stored in the first counter register only when receiving the first level of the second control signal from the second control circuit, and the third counter register receives the TAP address stored in the second counter register only when receiving the first level of the third control signal.

As another preferred embodiment of the present invention, a semiconductor memory device with a function of a split read/write transfer by which data stored in memory cells in a row being divided into two parts and then transferred alternately, comprises:

a dynamic random access memory array having a plurality of dynamic random access memory cells arranged in matrix, the dynamic random access memory cells being divided into a first memory cell part and a second memory cell part;

a serial data register comprising a plurality of registers divided into a first serial data register and a second serial data register, the first serial data register for storing one half of data stored in the memory cells in a row, the second serial data register for storing other half of data stored in the memory cells in the row, and a serial data stream of continuous serial data being transferred between the plurality of dynamic random access memory cells and the serial data register;

a serial selector comprising a first serial selector and a second serial selector, the first serial selector being connected to the first serial data register, the second serial selector being connected to the second serial data register, the first serial selector and the second serial selector for selecting the register in the first serial data register and the second serial data register;

a boundary address register for storing boundary addresses;

a first control circuit for receiving the boundary address from the boundary address register,
 comparing the number of new boundary addresses with the number of old boundary addresses which being previously stored in the boundary address register,
 generating a first level of a fifth control signal when the number of the new boundary addresses being greater than the number of the old boundary addresses,
 generating a first level of a sixth control signal when the number of the new boundary addresses being smaller than the number of the old boundary addresses, and
 generating a second level of the sixth control signal when the number of the new boundary addresses not being smaller than the number of the old boundary addresses;

a counter comprising a first counter register, a second counter register, a third counter register, and a fourth counter register, the first counter register receiving a TAP address and storing the TAP address, the second counter register and the fourth counter register receiving the TAP address from the first counter register and storing the TAP address, and the third counter register receiving the TAP address from the second counter register and generating a current address obtained by incrementing the TAP address when receiving a serial clock and transferring the current address to the selector;

a second control circuit for comparing the current address stored in the third counter register with the boundary address stored in the boundary address register only when not receiving the first level of the fifth control signal,
 generating a first level of a second control signal when the current address stored in the third counter register being agree with the boundary address stored in the boundary address register, and
 generating a first level of a third control signal during the split read/write transfer when the third counter register receives a first serial clock after the current address stored in the third counter register being agree with the boundary address; and a third control circuit for generating a fourth control signal for selecting one of the first serial data register and the second serial data register alternately
 when the TAP address stored in the first counter register being agreed with the boundary address stored in the boundary address register under receiving the second level of the sixth control signal from the first control circuit, and
 when the TAP address stored in the fourth counter register being agreed with the boundary address stored in the boundary address register under receiving the first level of the sixth control signal from the first control circuit,
 wherein the second counter register and the fourth counter register receive the TAP address stored in the first counter register only when receiving the first level of the second control signal from the second control circuit, and the third counter register receives the TAP address stored in the second counter register only when receiving the first level of the third control signal.

As another preferred embodiment of the present invention, a semiconductor memory device with a function of a split read/write transfer by which data stored in memory cells in a row being divided into two parts and then transferred alternately, comprises:

a dynamic random access memory array having a plurality of dynamic random access memory cells arranged in matrix, the dynamic random access memory cells being divided into a plurality of memory cell parts;

a serial data register comprising a plurality of registers divided into a plurality of serial data register parts, each serial data register part storing a part of data stored in the memory cells in a row;

a transfer gate comprising a plurality of transfer gates located between the plurality of memory cell parts and the plurality of serial data register parts;

a serial selector comprising a plurality of serial selector being connected to the plurality of serial data register parts, for selecting the register in the plurality of serial data register parts;

a boundary address register for storing a boundary address;

a first control circuit for receiving the boundary address from the boundary address register, comparing a new boundary address and an old boundary address which being previously stored in the boundary address register, generating a first level of a first control signal when the new boundary address being different from the old boundary address;

a counter comprising a first counter register, a second counter register, and a third counter register, the first counter register receiving a TAP address and storing the TAP address, the second counter register receiving the TAP address from the first counter register and storing the TAP address, and the third counter register receiving the TAP address from the second counter register and generating a current address obtained by incrementing the TAP address when receiving a serial clock and transferring the current address to the serial selector;

a second control circuit for comparing the current address stored in the third counter register with the boundary address stored in the boundary address register only when not receiving the first level of the first control signal, generating a first level of a second control signal when the current address stored in the third counter register being agree with the boundary address stored in the boundary address register, and generating a first level of a third control signal during the split read/write transfer when the third counter register receives a first serial clock after the current address stored in the third counter register being agree with the boundary address; and a third control circuit for comparing the TAP address stored in the first counter register with the boundary address, and generating a fourth control signal for selecting one serial data register of the plurality of serial data register parts alternately when the TAP address stored in the first counter register being agreed with the boundary address stored in the boundary address register, wherein the second counter register receives the TAP address stored in the first counter register only when receiving the first level of the second control signal from the second control circuit, and the third counter register receives the TAP address stored in the second counter register only when receiving the first level of the third control signal.

As another preferred embodiment of the present invention, a semiconductor memory device with a function of a split read/write transfer by which data stored in memory cells in a row being divided into two parts and then transferred alternately, comprises:

a dynamic random access memory array having a plurality of dynamic random access memory cells arranged in matrix, the dynamic random access memory cells being divided into a plurality of memory cell parts;

a serial data register comprising a plurality of registers divided into a plurality of serial data register parts, each serial data register part storing a part of data stored in the memory cells in a row;

a transfer gate comprising a plurality of transfer gates located between the plurality of memory cell parts and the plurality of serial data register parts;

a serial selector comprising a plurality of serial selector being connected to the plurality of serial data register parts, for selecting the register in the plurality of serial data register parts;

a boundary address register for storing boundary addresses;

a first control circuit for receiving the boundary address from the boundary address register, comparing the number of new boundary addresses with the number of old boundary addresses which being previously stored in the boundary address register, generating a first level of a fifth control signal when the number of the new boundary addresses being greater than the number of the old boundary addresses, generating a first level of a sixth control signal when the number of the new boundary addresses being smaller than the number of the old boundary addresses, and generating a second level of the sixth control signal when the number of the new boundary addresses not being smaller than the number of the old boundary addresses;

a counter comprising a first counter register, a second counter register, a third counter register, and a fourth counter register, the first counter register receiving a TAP address and storing the TAP address, the second counter register and the fourth counter register receiving the TAP address from the first counter register and storing the TAP address, and the third counter register receiving the TAP address from the second counter register and generating a current address obtained by incrementing the TAP address when receiving a serial clock and transferring the current address to the serial selector;

a second control circuit for comparing the current address stored in the third counter register with the boundary address stored in the boundary address register only when not receiving the first level of the fifth control signal, generating a first level of a second control signal when the current address stored in the third counter register being agree with the boundary address stored in the boundary address register, and generating a first level of a third control signal during the split read/write transfer when the third counter register receives a first serial clock after the current address stored in the third counter register being agree with the boundary address; and a third control circuit for generating a fourth control signal for selecting one serial data register part of the plurality of serial data register parts when the TAP address stored in the first counter register being agreed with the boundary address stored in the boundary address register under receiving the second level of the sixth control signal from the first control circuit, and when the TAP address stored in the fourth counter register being agreed with the boundary address stored in the boundary address register under receiving the first level of the sixth control signal from the first control circuit, wherein the second counter register and the fourth counter register receive the TAP address stored in the first counter register only when receiving the first level of the second control signal from the second control circuit, and the third counter register receives the TAP address stored in the second counter register only when receiving the first level of the third control signal.

BRIEF DESCRIPTION OF THE DRAWINGS

These and other objects, features, and advantages of the present invention will become more apparent from the following description of the preferred embodiments taken in conjunction with the accompanying drawings, in which:

FIG. 3 is a timing chart of a split transfer operation of the conventional semiconductor memory device shown in FIG. 1.

FIG. 8D and FIG. 8D-1 are configuration diagrams of a row decoder in the semiconductor memory device shown in FIG. 8A.

DETAILED DESCRIPTION OF THE PREFERRED EMBODIMENTS

Other features of this invention will become apparent in the course of the following description of exemplary embodiments which are given for illustration of the invention and are not intended to be limiting thereof.

A dual-port semiconductor memory device having a split transfer function as an embodiment of the present invention used for graphics will now be explained.

Figure 8A:
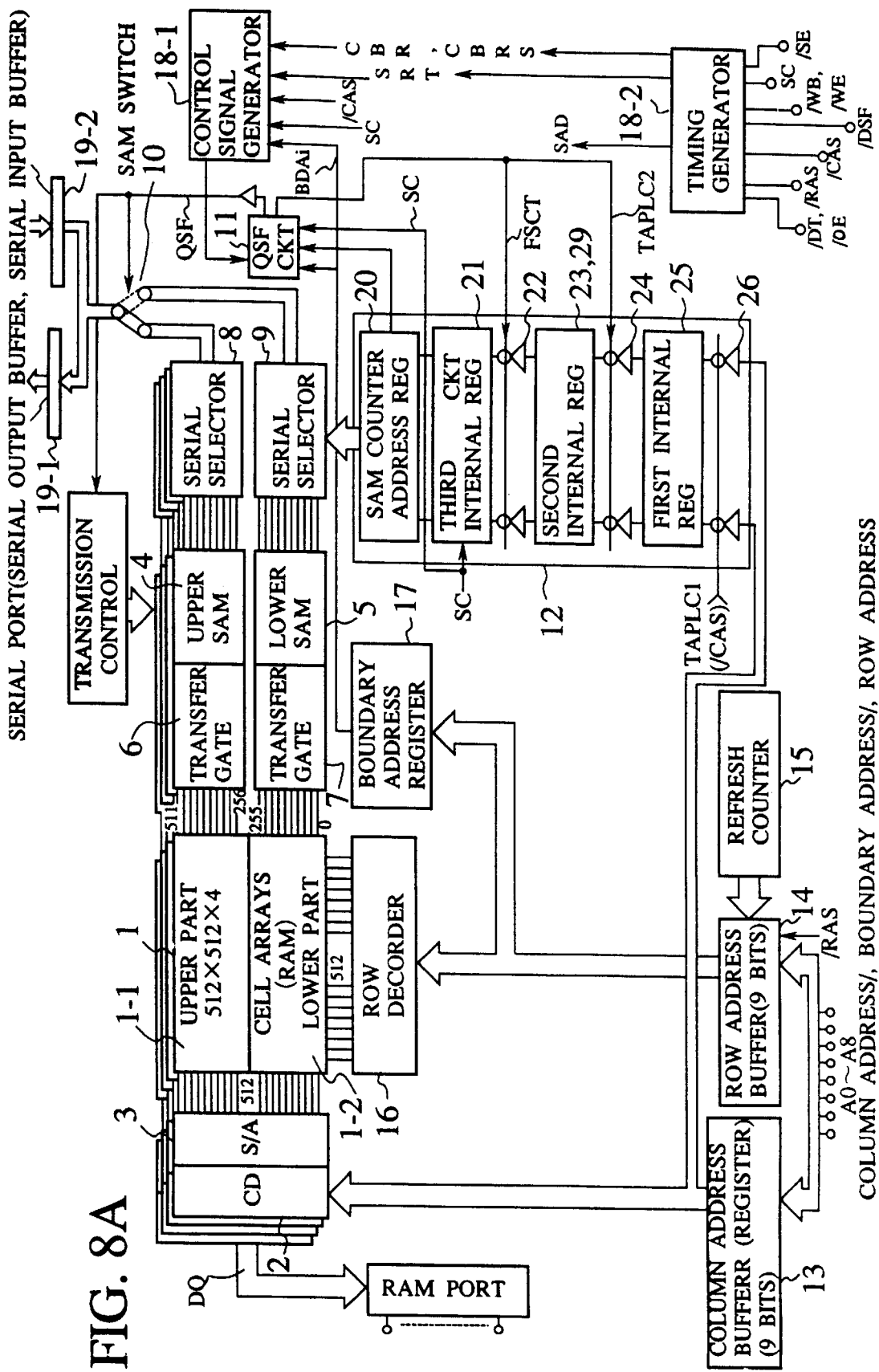
FIG. 8A is a block diagram showing a configuration of a semiconductor memory device of the present invention.

FIG. 8A is a configuration diagram of a dual-port (a ram port and a serial port) semiconductor memory device having a split transfer function as a preferred embodiment of the present invention. In FIG. 8A, a Random Access Memory (RAM) cell array 1 including a plurality of dynamic random access memory cells (DRAM cells) is a core section of the dual-port semiconductor memory device.

The dual-port semiconductor memory device comprises a plurality of RAM cell arrays (including 512×512×4 RAM cell arrays), each RAM cell array including a plurality of dynamic random access memory (DRAM) cells arranged in a matrix which is divided into the two parts (an upper part 1-1 and a lower part 1-2), a column decoder(CD) 2, a sense amplifier(S/A) 3, a SAM divided into the upper SAM 4 and the lower SAM 5, two transfer gates 6 and 7, serial selectors 8 and 9, a row decoder 16, column address buffer (register) 13, a row address buffer 14, a refresh counter 15, a boundary address register 17, a serial address counter 12, a QSF circuit 11 for generating a control signal QSF, a control signal generator 18-1, a timing generation circuit (a timing generator) 18-2, a SAM switch 5, a serial output buffer 19-1, a serial input buffer 19-2, and a RAM port (input/output buffer).

In order to simplify the explanation of the present invention, the DRAM cells in the cell array 1 are divided into the upper part 1-1 and the lower part 1-2. The SAM is also divided into two parts, an upper SAM 4, and a lower SAM 5. The number of registers in the SAM is 512. Therefore the registers in the SAM are addressed by the SAM addresses of 512 bits (0 to 511). A control signal SC(n) indicates the n-th register in the SAM, and a SRT(m) indicates a split transfer mode or cycle having a tap address of m.

Figure 8B:
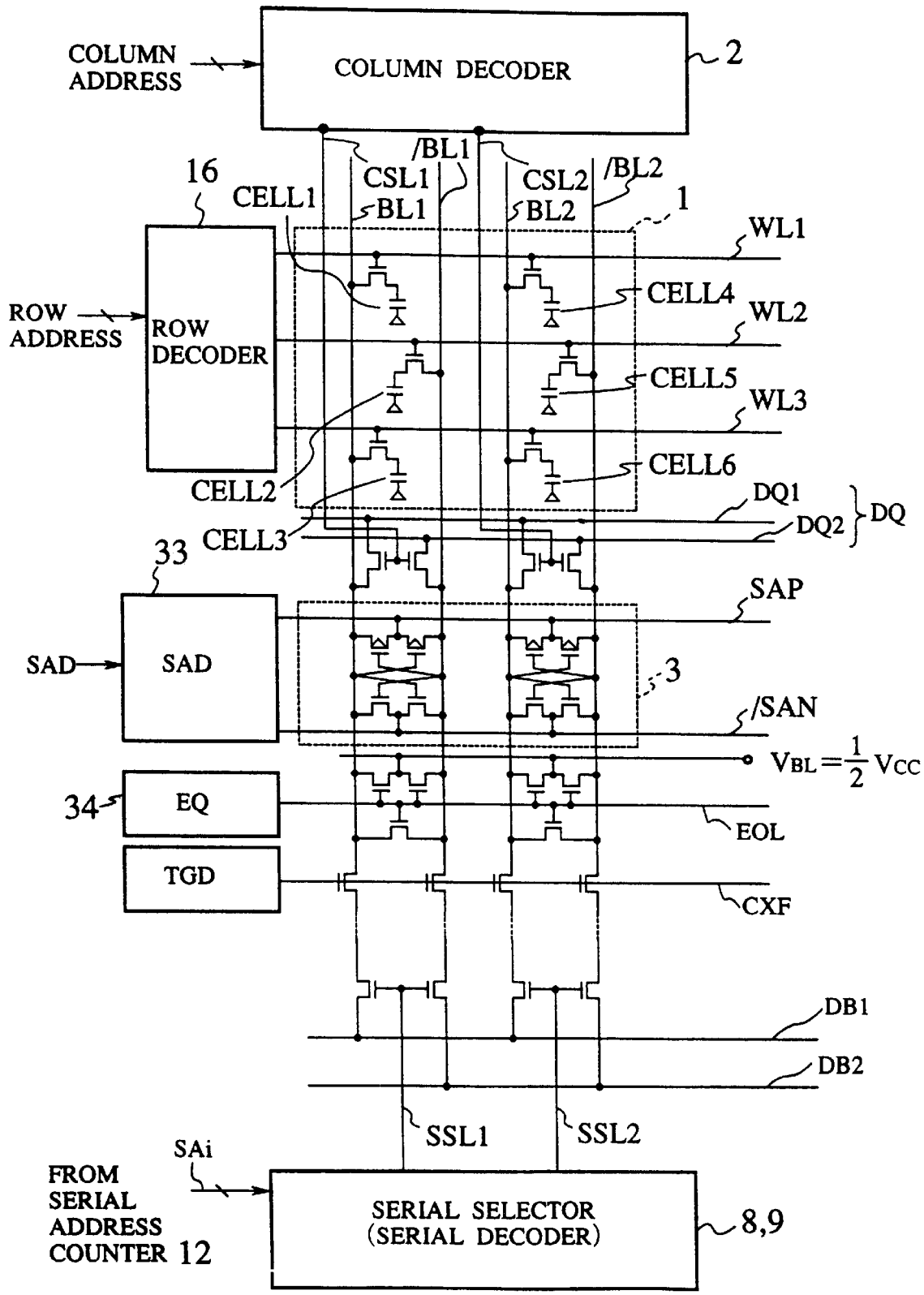
FIG. 8B is a configuration diagram mainly showing memory cells in a RAM in the semiconductor memory device shown in FIG. 8A.

FIG. 8B is a configuration diagram mainly showing memory cells CELL1, CELL2, . . . , CELL6 in the RAM 1 in the dual-port semiconductor memory device shown in FIG. 8A.

For example, memory cells CELL1 and CELL2 connected to a word line WL1 are selected by the row decoder 16. Bit lines BL1, /BL1, BL2, and /BL2 are equalized by the equalizer EQ 34. The data in the memory cells CELL1 and CELL2 selected by the row decoder 16 are transferred to bit lines BL1 and /BL1 which are selected through column selection lines CSL1 by the column decoder 2.

The data on the bit lines BL1 and /BL1 are sensed by a sense amplifier 3 whose operation is controlled by a sense amplifier driver (SAD) 33, and then the data on the bit lines BL1 and /BL1 are transferred to data buses DB1 and DB2, continuously by serial selectors 8 and 9 (serial decoders). The data on the data buses DB1 and DB2 are transferred to an external device (not shown) through the data output buffer 19-1.

The sense amplifier (S/A) 3 includes two P channel MOS transistors (PMOS pair) connected between bit lines BL1 and /BL1, and BL2 and /BL2 in series and two N type MOS transistors (NMOS pair) connected between the bit lines BL1 and /BL1, and BL2 and /BL2 in series. Both sides of the PMOS pair are connected to the bit lines BL1 and /BL1, and BL2 and /BL2. Both sides of the NMOS pair are also connected to the bit lines BL1 and /BL1, and BL2 and /BL2. An intermediate point between the PMOS pair is connected to a control signal SAP line. An intermediate point between the NMOS pair is connected to a control signal /SAN line. Both gates of the PMOS transistor and the NMOS transistor are connected to the bit line /BL1 and /BL2. Both gates of the PMOS transistor and the NMOS transistor are connected to the bit line BL1 and BL2.

Figure 8C:
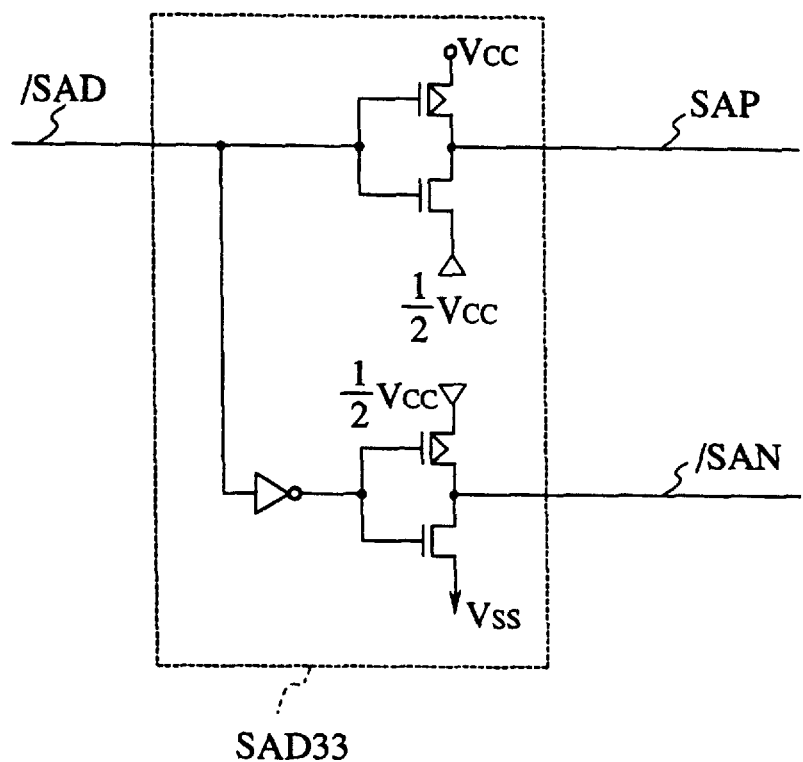
FIG. 8C is a sense amplifier driver for a sense amplifier (S/A) in the semiconductor memory device shown in FIG. 8A.
Figure 8D:
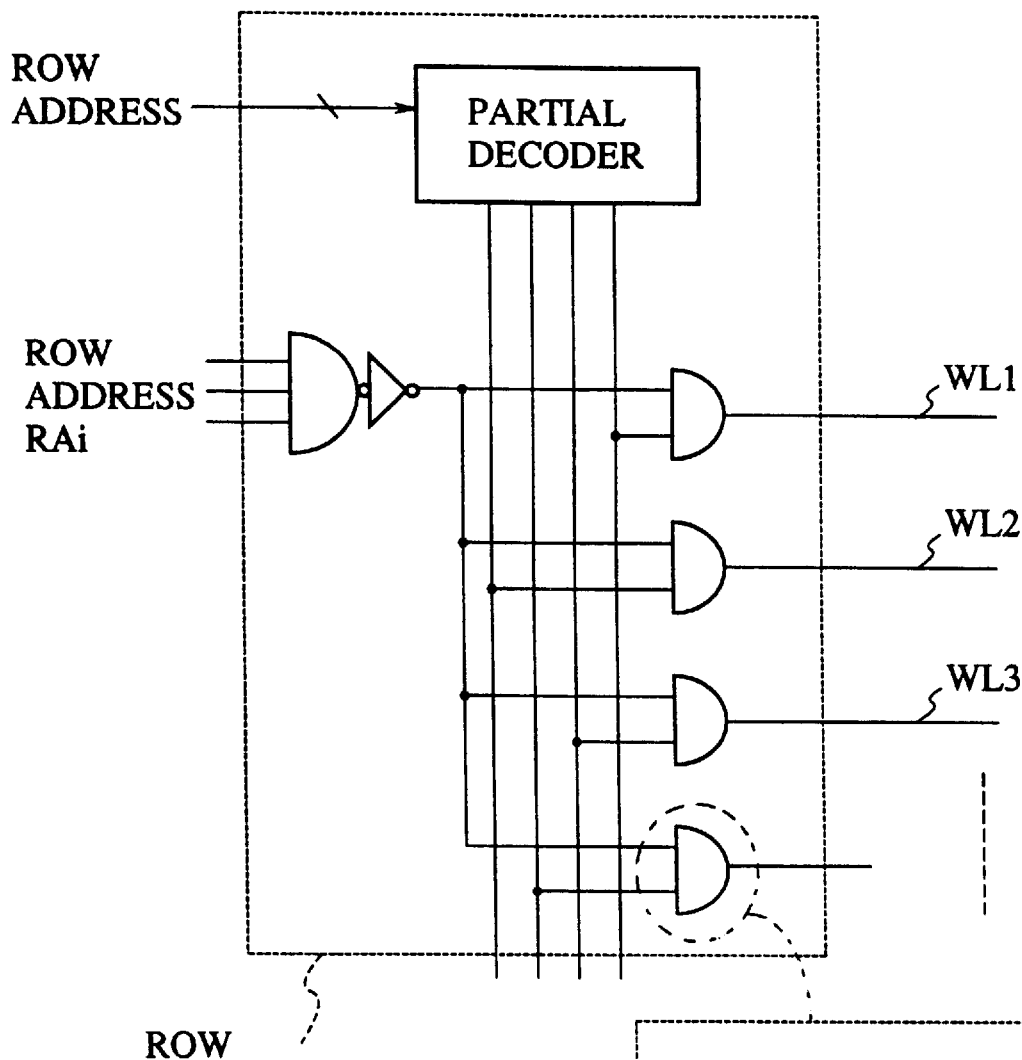
Figures 1, 8D:
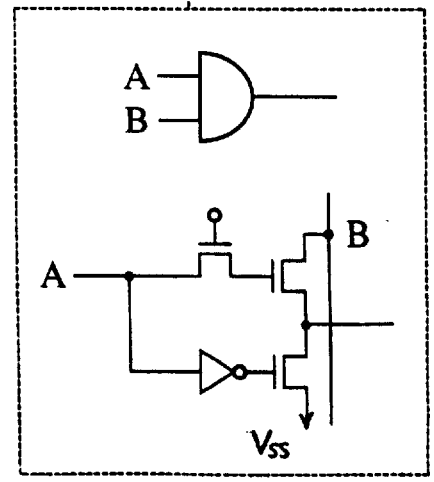

FIG. 8C is a sense amplifier driver (SAD) 33 for the sense amplifier (S/A) 3 in the dual-port semiconductor memory device shown in FIG. 8B. The operation of the sense amplifier driver SAD33 is controlled by a control signal SAD transferred from the timing generator 18-2. FIG. 8D is a configuration diagram of a row decoder in the dual-port semiconductor memory device shown in FIG. 8A. A row address (RAi) from the row address buffer 14 is received by the row decoder 16 in order to select one of the word lines WL1, WL2, WL3, . . .

Figure 8E:
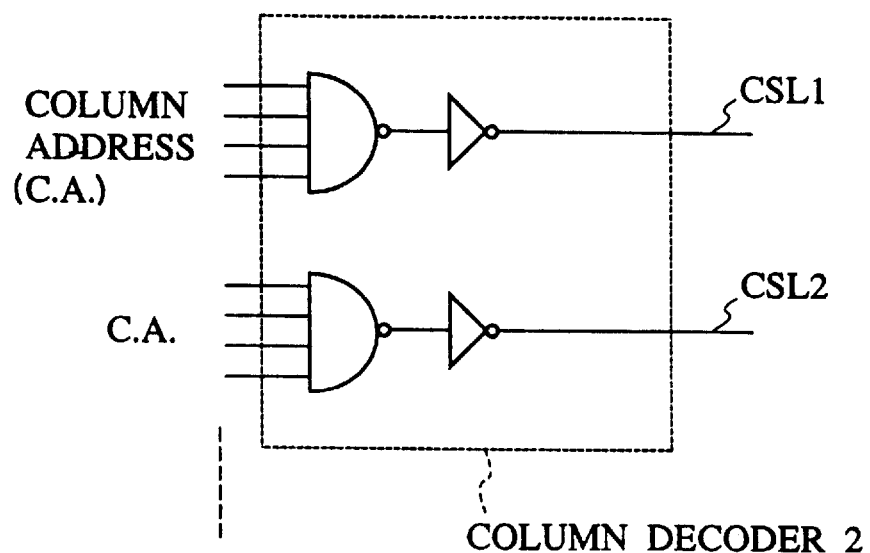
FIG. 8E is a configuration diagram of a column decoder 2 in the semiconductor memory device shown in FIG. 8A.

FIG. 8E is a configuration diagram of a column decoder 2 in the dual-port semiconductor memory device shown in FIG. 8A. A Column address (C.A.) from the column address buffer 13 is received by the column decoder 2 in order to select one of the column selection lines CSL1 and CSL2.

Figure 8F:
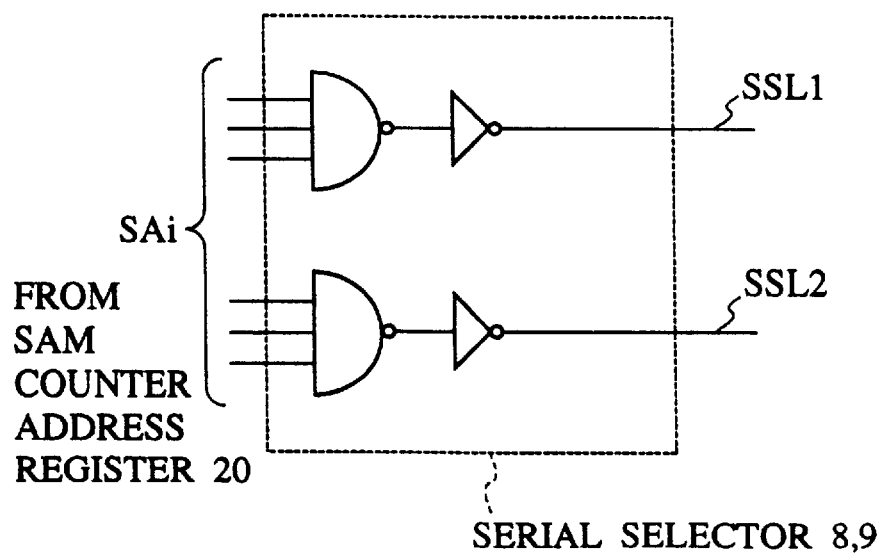
FIG. 8F is a configuration diagram of a serial selector in the semiconductor memory device shown in FIG. 8A.

FIG. 8F is a configuration diagram of a serial selector in the dual-port semiconductor memory device shown in FIG. 8A. A SAM counter address (SAi) in the SAM counter address register 20 is received by the serial selectors 8 and 9 in order to select the bit line pair BL1 and /BL1 or BL2 and /BL2.

In a normal transfer, data stored in the memory cells in a row in the memory cell array 1 are transferred to registers in the upper SAM 4 and the lower SAM 5 through the transfer gates 6 and 7. The data in the registers in the upper SAM 4 and the lower SAM 5 are transferred serially to an external device such as a display device (not shown) through the serial output buffer 19-1. The display device displays the data from the upper SAM 4 and the lower SAM 5.

On the other hand, a split transfer has been used in order to transfer the data stored in the memory cells in the row to the registers in the upper SAM 4 and the lower SAM 5. Then, the data in the registers in the upper SAM 4 or the lower SAM 5 are transferred to the external device through the serial output buffer 19-1, with good efficiency.

A split transfer under the split transfer mode is a mode in which the memory cells in a row in the RAM cell array 1 are divided into the upper part 1-1 and the lower part 1-2. The data stored in the registers in the upper SAM 4 and the lower SAM 5 in the SAM are transferred sequentially to the external device through the serial output buffer 19-1, alternately. In a normal readout transfer, synchronization of the timing of the data transfer from the RAM cell array 1 to the SAM 4 and 5 and the timing of the input of a serial clock SC is very strict so that the data output from the SAM occurs without interruption because next transfer data must be transferred to the registers in the SAM from the memory cells in a next row while an address pointer indicating a readout position in the registers in the SAM returns to a start address position in the registers of the SAM.

However, in the split transfer, by dividing the SAM into two (the upper SAM 4 and the lower SAM 5), there are no strict timing requirements and the output from the registers in the SAM takes place without interruption because data in the memory cells in the RAM 1 are transferred to the upper SAM 4 while data in the registers of the lower SAM 5 are transferred to the external device.

The data readout from the registers in the upper SAM 4 and the lower SAM 5 under the split transfer is initiated at the register addressed by a TAP address which has been set in this split transfer cycle (SRT cycle) and the data readout is completed at the register indicated by a boundary address which has been previously set.

The registers in the upper SAM 4 and the lower SAM 5 are divided into $2^n$ parts (where n=1, 2, 3, . . . ) by using boundary addresses so that the data read out from the registers in the upper SAM 4 and the lower SAM 5 are efficiently displayed on the screen. In the case where the data readout from the registers in the upper SAM 4 and the lower SAM 5 are in a continuous split transfer mode, a pointer indicating an address of a register in the upper SAM 4 and the lower SAM 5 jumps to another register in the SAM as a next data readout position indicated by a next TAP address for a next split transfer after a pointer indicating the register in the upper SAM 4 and the lower SAM 5 as a readout position reaches a boundary address of the current split transfer.

A control signal QSF, the SAM counter address (SAi) stored in the SAM counter address register 20, the boundary addresses in the boundary address register 17, and the TAP address are used for pointing the address of one of the registers in the upper SAM 4 and the lower SAM 5. The level of the control signal QSF indicates one of the upper SAM 4 and the lower SAM 5. For example, if the level of the control signal QSF is at the high level, the upper SAM 4 is selected, if at the low level, the lower SAM 5 is selected.

The control method for a SAM counter address (SAi) and the control signal QSF will now be described with reference to FIGS. 8A, 9, 10, 11A, 11B, and 11C.

FIG. 8A, data stored in the memory cells of the upper part 1-2 or the lower part 1-2 in a row in the RAM 1 are transferred to registers in the upper SAM 4 or in the lower SAM 5 through the transfer gate 6 or the transfer gate 7. The data in the registers in the upper SAM 4 and the lower SAM 5 are selected by the serial selector 8 or 9 and transferred to the external device (not shown). An address to select one of the register in the upper SAM 4 and the lower SAM 5 is transferred from a serial address counter 12 to the serial selectors 8 and 9.

Figure 9:
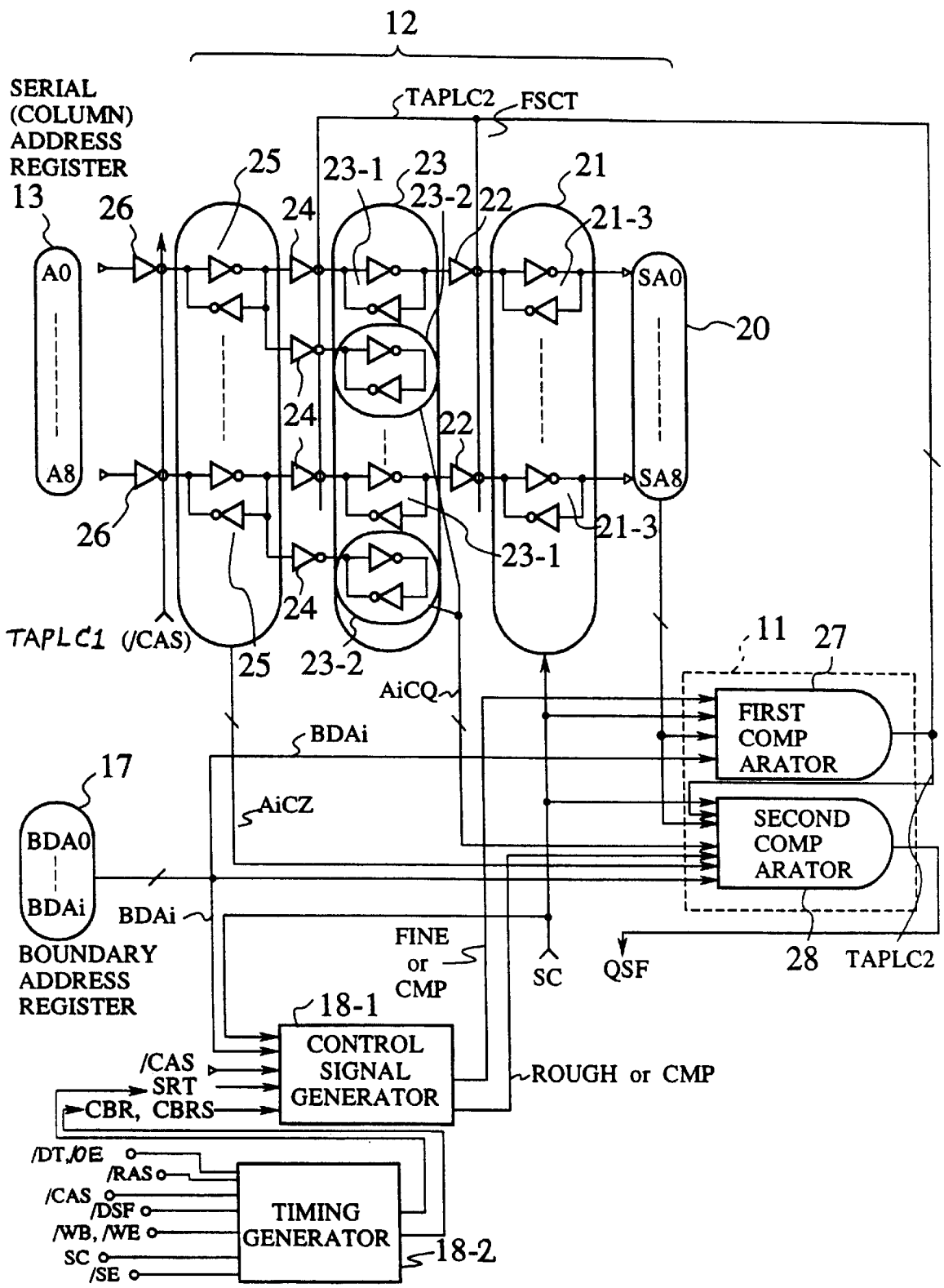
FIG. 9 is a configuration diagram of a serial address counter in the semiconductor memory device shown in FIG. 8A.

FIG. 9 is a configuration diagram of the serial address counter 12 incorporated in the dual-port semiconductor memory device shown in FIG. 8A.

Figure 10:
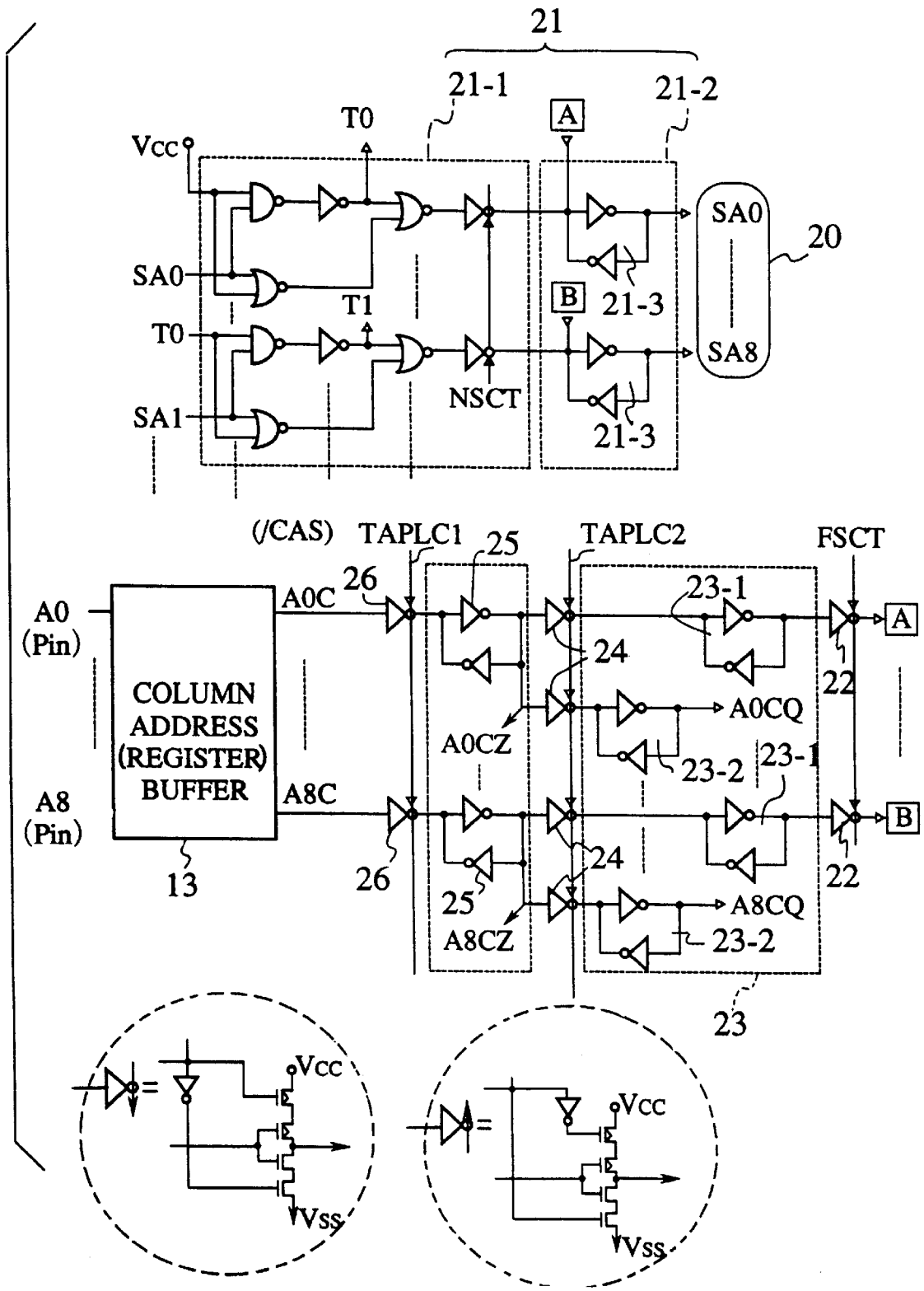
FIG. 10 is a detailed configuration diagram of internal address register circuits and a SAM counter address register in a serial address counter shown in FIG. 9.

FIG. 10 is a detailed configuration diagram of internal address registers 25, 23-1, 23-2, and 21-3 and the SAM counter address register 20 in the serial address counter 12 shown in FIG. 9.

As shown in FIG. 8A, a TAP address is transferred to first internal address register 25 in the serial address counter 12 from the column address register 13 of 9 bits through first transfer gates 26 while a column address strobe signal /CAS is changed to the low level.

Boundary addresses are transferred to a boundary address register 17 from a row address buffer (9 bits) 14 when a row address strobe signal /RAS is changed to the low level.

In FIG. 9, a TAP address is latched into first internal address register 25 in the serial address counter 12. When a TAP address latched in the first internal address register 25 is transferred to second internal address register 23 including second register 23-1 and save register 23-2) when a SAM counter address (SAi) stored in the SAM counter address register 20 is agreed with a boundary address (DBAi) stored in the boundary address register 17 by a first comparator 27 in the QSF circuit 11. When agreed, as shown in FIG. 11B, the first comparator 27 generates control signals TAPLC2 and STPA and transmits the control signal TAPLC2 to the second transfer gate 24 located between the first internal address register 25 and the second internal address register 23. By receiving the control signal TAPLC2 from the first comparator 27, the second transfer gate 24 transfers the TAP address stored in the first internal address register 25 to the second register 23-1 and the save register 23-2.

The TAP address stored in the second register 23-1 is transferred to the third internal address register 21-3 in the third internal address register circuit 21 when receiving a control signal FSCT. This control signal FSCT is generated when a first serial clock SC is received after the SAM counter address (SAi) is agreed with the boundary address (BDAi) by the first comparator 27 shown in FIG. 11B.

Then, the TAP address stored in the third internal address register 21-3 is transferred to the SAM counter address register 20.

A control signal QSF used for switching the SAM switch 10 is generated by the second comparator 28 in the QSF circuit 800.

Figure 11A:
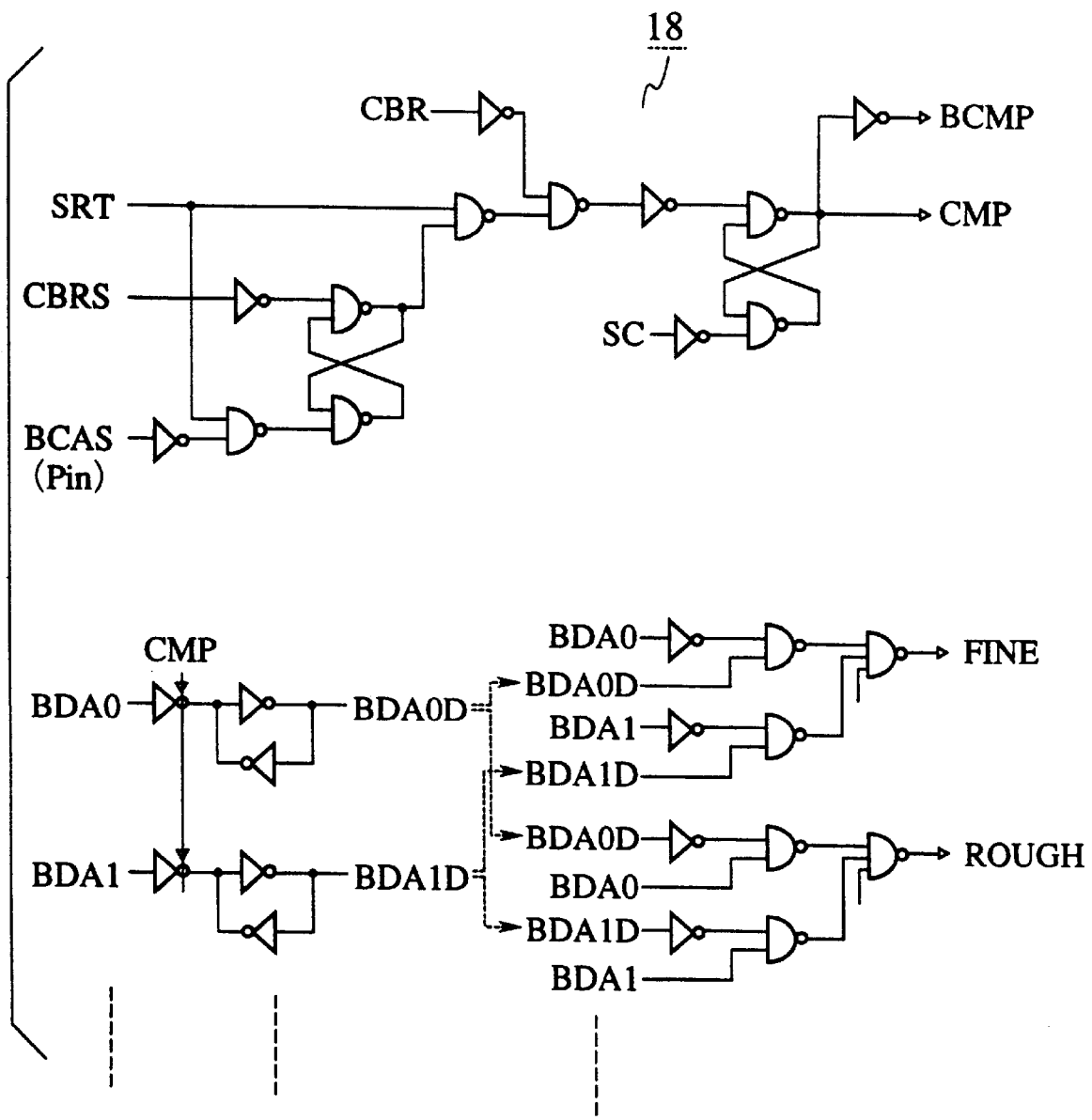
FIG. 11A is a configuration diagram of a control signal generator in the semiconductor memory device shown in FIG. 8A.
Figure 11B:
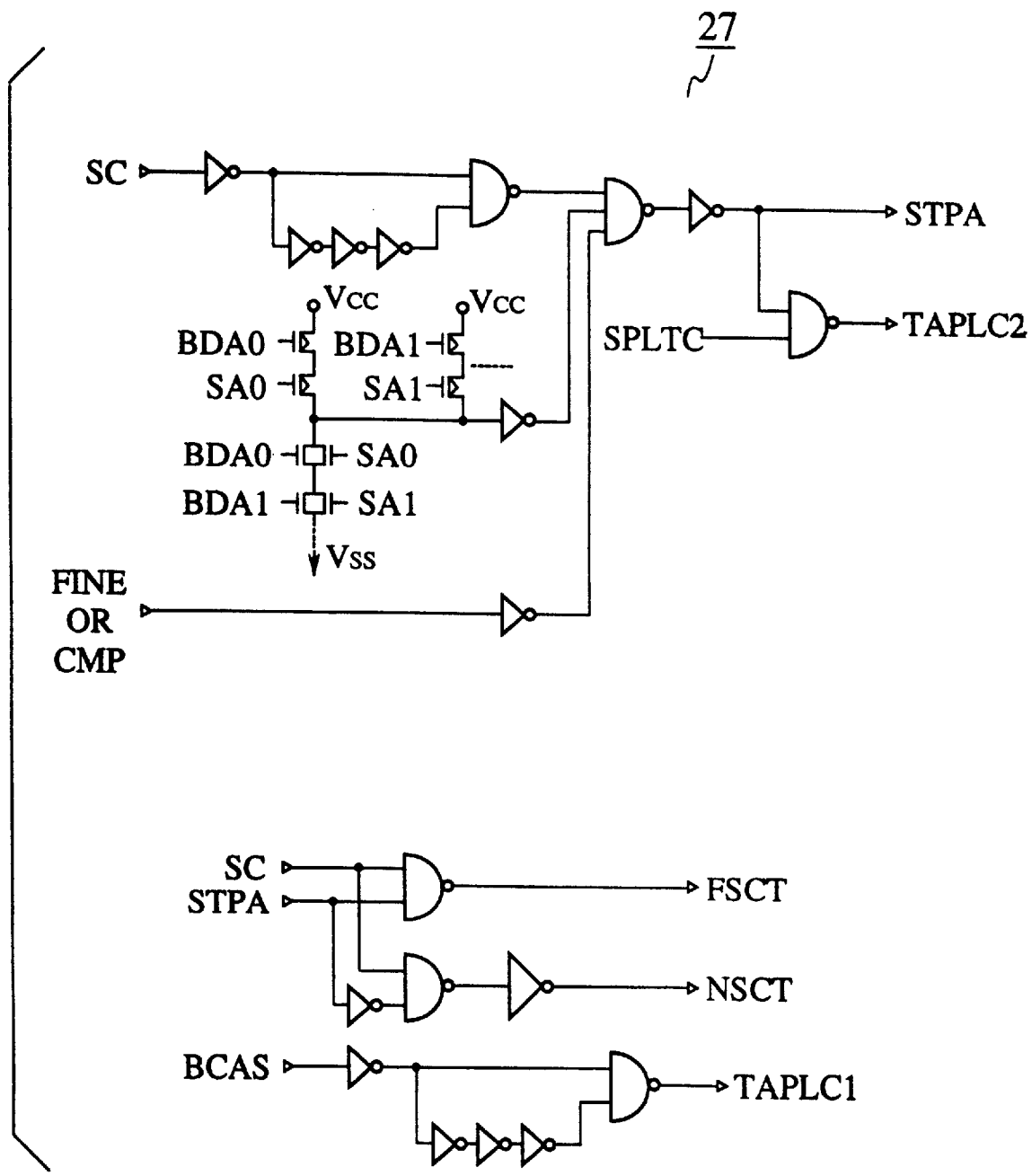
FIG. 11B is a configuration diagram of a first comparator in a QSF circuit in the semiconductor memory device of the present invention shown in FIG. 8A.
Figure 11C:
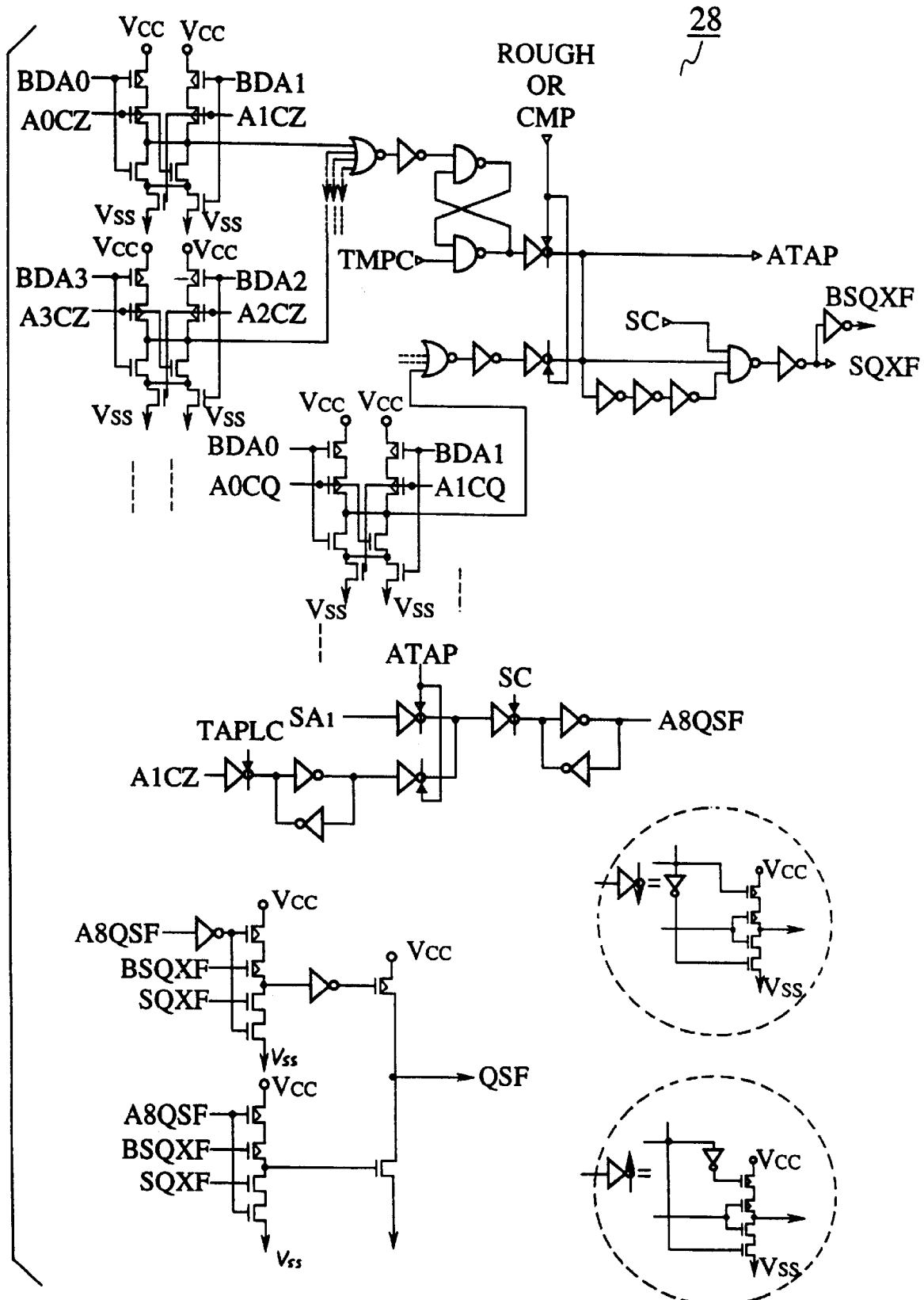
FIG. 11C is a configuration diagram of a second comparator in a QSF circuit in the semiconductor memory device shown in FIG. 8A.

FIG. 11C shows a detailed configuration diagram of the second comparator 28. The control signal QSF is generated by comparing the SAM counter address (SAi, where i=0, 1, . . . ,8) stored in the SAM counter address register 20, the boundary address (BDAi, where i=0, 1, . . . ,8) stored in the boundary address register 17, and a TAP address (AiCZ or AiCQ, where i=0, 1, . . . , 8) stored in the first internal address register 25.

The control signal QSF switches the SAM switch 10 in order to select data stored in the registers in the upper SAM 4 or the lower SAM 5. By this, the data in the registers in the upper SAM 4 or the lower SAM 5 are transferred to the external device such as a display device through the serial output buffer 19-1.

For example, data in the registers in the upper SAM 4 are transferred to the external device while the control signal QSF is at the high level and data in the registers in the lower SAM 5 are transferred to the external device when the control signal QSF is at the low level.

In controlling the SAM counter address stored in the SAM counter address register 20, with a SAM counter address (SAi) is incremented by "1"such as SAi=(SAi+1) according to receive the serial clock SC at a counter section 21-1 in the third internal address register circuit 21 under the normal operation mode, not under the split transfer mode.

In the normal operation mode, the SAM counter address (SAi) is returned to zero "0" when the SAM counter address (SAi) reaches to "511" (or to the 511-th register). As shown in FIG. 10, the reference number 21-1 designates the counter section. This counter section 21-1 is incremented by receiving a serial clock SC. The reference characters T0 and T1 are incremented values.

In addition, in the split transfer mode, the value of the SAM counter address (SAi) is changed by receiving a next TAP address which has been set when the SAM counter address (SAi) points to the register in the SAM addressed by the boundary address.

In FIGS. 8A, 9, and 10, the TAP address is transferred to the first internal address register 25 in the serial address counter 12 from the column address register 13 of 9 bits through first transfer gate 26 while a column address strobe signal /CAS is changed to the low level.

A boundary address transferred from the row address buffer (9 bits) 14 is transferred to a boundary address register 17 when a row address strobe signal /RAS is at the low level.

In FIGS. 9 and 10, a TAP address is latched into the first internal address register 25 in the serial address counter 12. When the TAP address latched into the first internal address register 25 is transferred to the second internal address register 23 when a SAM counter address (SAi) stored in the SAM counter address register 20 is agreed with a boundary address stored in the boundary address register 17 by the first comparator 27 in the QSF circuit 11. When agreed, the first comparator 27 generates an agreement signal (a control signal TAPLC2) and transmits the control signal TAPLC2 to the second transfer gates 24 located between the first internal address register 25 and the second internal address register 23.

By receiving the control signal TAPLC2 as the agreement signal transferred from the first comparator 27, the second transfer gates 24 transfers the TAP address stored in the first internal address register 25 to the second internal address register 23-1 and the save register 23-2.

The TAP address stored in the second internal address register 23 is transferred to the third internal address register 21-3 when the next serial clock SC is received by the first comparator 27 in the QSF circuit 11.

When this next serial clock SC is received, the control signal FSCT which indicates to receive a first serial clock SC after the SAM counter address (SAi) is agreed with the boundary address is generated and transferred to the third transfer gate 22.

FIG. 11B is a circuit diagram of the first comparator 27 in the QSF circuit 11.

When the SAM counter address SAi(SA0, SA1, . . . , SA8) in the SAM counter address register 20 is agreed with the boundary address BDAi(BDA0, BDA1, . . . , BDA8) stored in the boundary address register 17, the first comparator 27 generates a control signal STPA and then generates the control signal FSCT by using the control signal STPA and the first serial clock SC as shown in FIG. 11B.

The TAP address stored in the third internal address register 21-3 is transferred to the SAM counter address register 20.

As shown in FIG. 11C, the control signal QSF is generated based on a result of a comparing operation by the second comparator 28 in the QSF circuit 11 in which a SAM counter address (SAi) stored in the SAM counter address register 20 or a boundary address (BDAi) stored in the boundary address register 17 is compared with a TAP address (AiCZ shown in FIG. 10) stored in the first internal register 25 or a TAP address (AiCQ shown in FIG. 10) stored in the save register 23-2. These comparing operations will be described in detail later.

There are following three modes (1) to (3) for readout data from the conventional dual-port semiconductor memory device.

(1) the CBRS mode is a "/CAS before /RAS refresh stop register set mode". A boundary address is changed in the CBRS mode.

(2) the SRT mode is "a split transfer mode" (SRT mode) which has been described above.

(3) the CBR mode is a "/CAS before /RAS refresh option reset mode" (CBR mode).

Figure 8G:
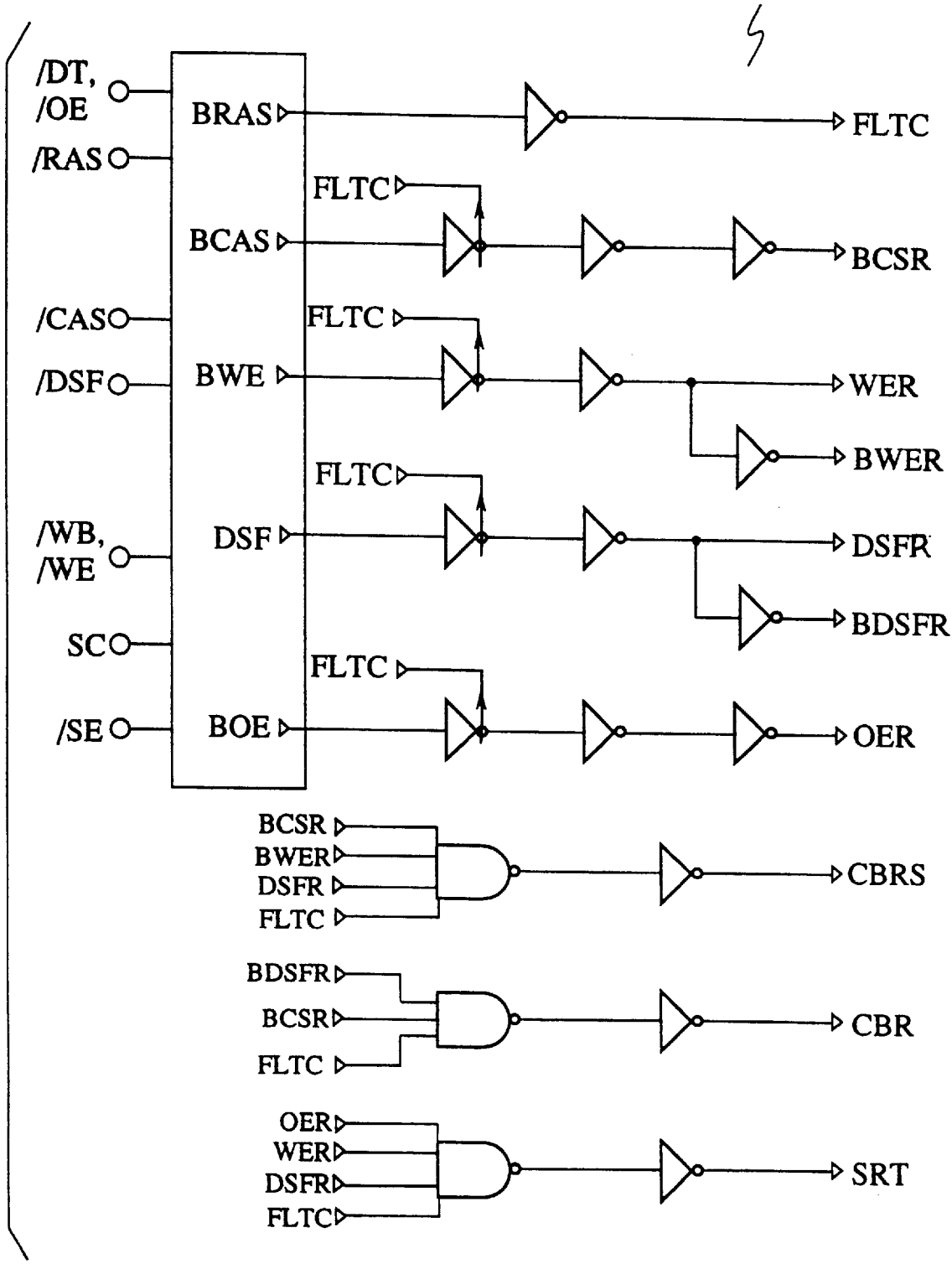
FIG. 8G is a configuration diagram of a timing generator in the semiconductor memory device shown in FIG. 8A.

FIG. 8G is a configuration diagram of a timing generator 18-2 in the semiconductor memory device shown in FIG. 8A.

The timing generator 18-2 receives control signals, a row address strobe /RAS, a column address strobe /CAS, a special function control /DSF, a serial clock SC, a serial enable /SE, a write per bit/a write enable /WB and /WE, a data transfer/output enable /DT and /OE, and then generates control signals a CBR for indicating the CBR mode, a CBRS for indicating the CBRS mode, a SRT for indicating the SRt mode, a SAD for driving the sense amplifier driver 33.

Timings or electrical potential levels of these control signals /RAS, /CAS, /DSF are set optionally by a user of a semiconductor memory device.

FIG. 11A is a configuration diagram of the control signal generator 18-1 in the dual-port semiconductor memory device shown in FIG. 8A.

The number of divisions of the boundary address (BDAi) stored in the boundary address register 17 is changed only by executing the CBR cycle (3) and the CBRS cycle (1).

Therefore the control signal generator 18-1 generates the control signal CMP of the high level when the CBR cycle or the CBRS cycle is executed. As shown in FIG. 11A, the control signal CMP designates an occurrence of a change of the number of boundary addresses which is occurred only when the CBR cycle or the CBRS cycle is executed.

As shown in FIG. 11A, control signals FINE and ROUGH are generated based on the combination of a new boundary address (BDAi) and an old boundary address (BDAiD). The new boundary address (BDAi) is transferred and latched by flip/flops based on the level of the control signal CMP.

The control signal FINE indicates the change of the number of the boundary addresses is increased. The control signal ROUGH indicates the change of the number of the boundary addresses is decreased.

In the dual-port semiconductor memory device of the present invention, the first comparator 27 receives the control signal CMP or FINE from the control signal generator 18-1, the boundary address (BDAi), and the SAM counter address (SAi).

The first comparator 27 performs a comparing operation between the SAM counter address (SAi) and the boundary address (BDAi) only when a control signal CMP is at the low level which indicates that there is no change of the number of divisions of the boundary addresses.

The control signal CMP of the high level indicates there is a change of the number of divisions of the boundary addresses. Therefore the first comparator 27 does not perform a comparing operation when receiving the control signal CMP of the high level.

In addition, when the control signal is at the low level, the second comparator 28 performs a comparing operation between the TAP address (AiCZ) stored in the first internal register 25 and the SAM counter address (SAi) stored in the SAM counter address register 20.

When the control signal is at the high level, the second comparator 28 performs a comparing operation between the TAP address (AiCQ) stored in the save register 23-2 and the SAM counter address (SAi) stored in the SAM counter address register 20.

In FIG. 11A, when the CBR cycle, the CBRS cycle, and the like for changing the number of divisions of the boundary address are executed during a split transfer mode or a continuous split transfer modes, the control signal generator 18-1 executes a comparing operation of the number of divisions between the previous boundary address (BDAiD) and a new boundary address (BDAi), and the control signal generator 18-1 generates a control signal ROUGH of the high level when the number of divisions is decreased, and generates a control signal FINE of the high level when the number of divisions is increased.

In other words, the control signal FINE and the control signal ROUGH are generated by the control signal generator 18-1 for judging whether the number of divisions of the boundary addresses is rough (or is decreased) or fine (or increased) when the boundary address is changed by the CBRS or CBR cycles.

The first comparator 27 executes the comparing operation only when the control signal FINE is at the low level, namely in the normal operation mode. The first comparator 27 does not execute the comparing operation when the control signal FINE is at the high level.

The second comparator 28 executes the comparing operation between the TAP address (AiCZ) stored in the first internal register 25 and the SAM counter address (SAi) stored in the SAM counter address register 20 when the control signal FINE is at the low level, namely in the normal operation mode.

The second comparator 28 executes a comparing operation between the TAP address (AiCQ) stored in the save register 23-2 and the SAM counter address (SAi) stored in the SAM counter address register 20 when the control signal FINE is at the high level.

In FIG. 11B, the first comparator 27 receives a serial clock SC, a boundary address (BDAi) stored in the boundary address register 17, and the control signal FINE or CMP from the control signal generator 18-1, and the first comparator 27 generates the control signal STPA and the control signal TAPLC2.

In FIG. 11B, the first comparator 27 compares a boundary address (BDAi, i=1, 2, . . . ,8) stored in the boundary address register 17 with the SAM counter address (SAi, i=1, 2, . . . ,8) in the SAM counter address register 20, then shows agreement of them, the first comparator 27 generates the control signal STPA of the high level. The control signal STPA changes to the high level when the serial clock SC is agreed with the boundary address (BDAi, i=1, 2, . . . ,8) compared by the first comparator 84.

The first comparator 27 generates the control pulse signal TAPLC2 when the serial clock SC is agreed with the boundary address during the split transfer cycle which is indicated by the high level of the control signal SPLTC.

In FIG. 11C, the second comparator 28 executes a comparing operation between the TAP address (AiCZ, i=1, 2, . . . ,8) stored in the first internal address register 25 and the SAM counter address (SAi, i=1, 2, . . . ,8) stored in the SAM counter address register 20 only when the control signal ROUGH is at the low level. In addition, the second comparator 28 executes a comparing operation between the TAP address (AiCQ; i=0, 1, . . . ,8) stored in the save register 23-2 and the SAM counter address (SAi, i=1, 2, . . . ,8) stored in the SAM counter address register 20 only when the control signal ROUGH is at the high level.

The control signal QSF is generated based on a result of a comparing operation by the second comparator 28 in which a SAM counter address (SAi) stored in the SAM counter address register 20 or a boundary address (BDAi) stored in the boundary address register 17 is compared with a TAP address (AiCZ shown in FIG. 10) stored in the first internal register 25 or a TAP address (AiCQ shown in FIG. 10) stored in save register 23-2. These comparing operations will be described in detail later.

Also, the control signal CMP showing that the number of divisions of the boundary addresses may also be generated by the circuit which generates the control signals FINE and ROUGH shown in FIG. 11A.

Next, the operations under the first to third SAM composite modes in the dual-port semiconductor memory device of the present invention will be explained.

Figure 12:
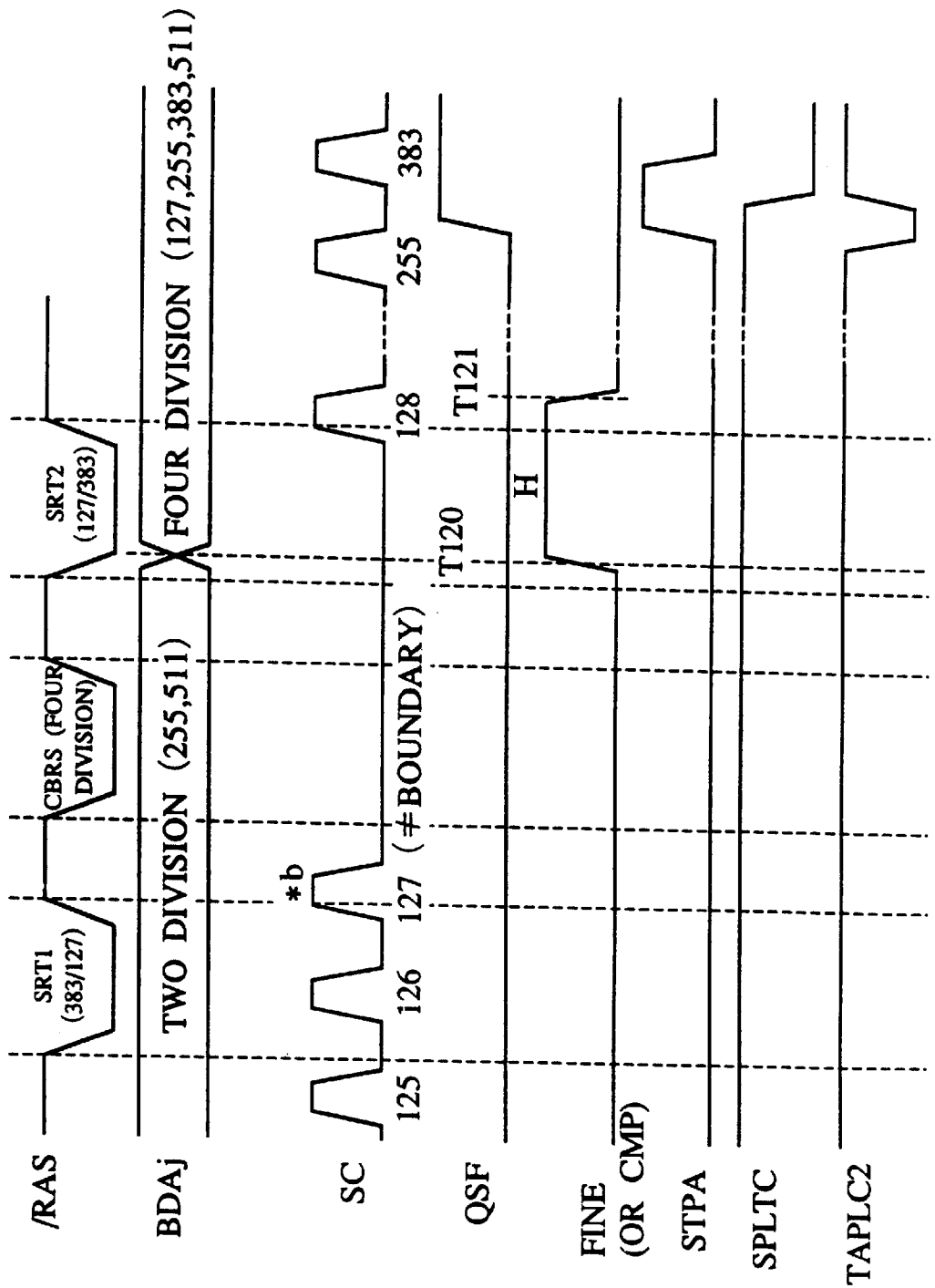
FIG. 12 is a timing chart for a SAM composite mode as a first example in the semiconductor memory device shown in FIG. 8A.

FIG. 12 is a timing chart for a split transfer operation under a SAM composite mode (Example 1) of the dual-port semiconductor memory device of the present invention shown in FIG. 8A.

Figure 1:
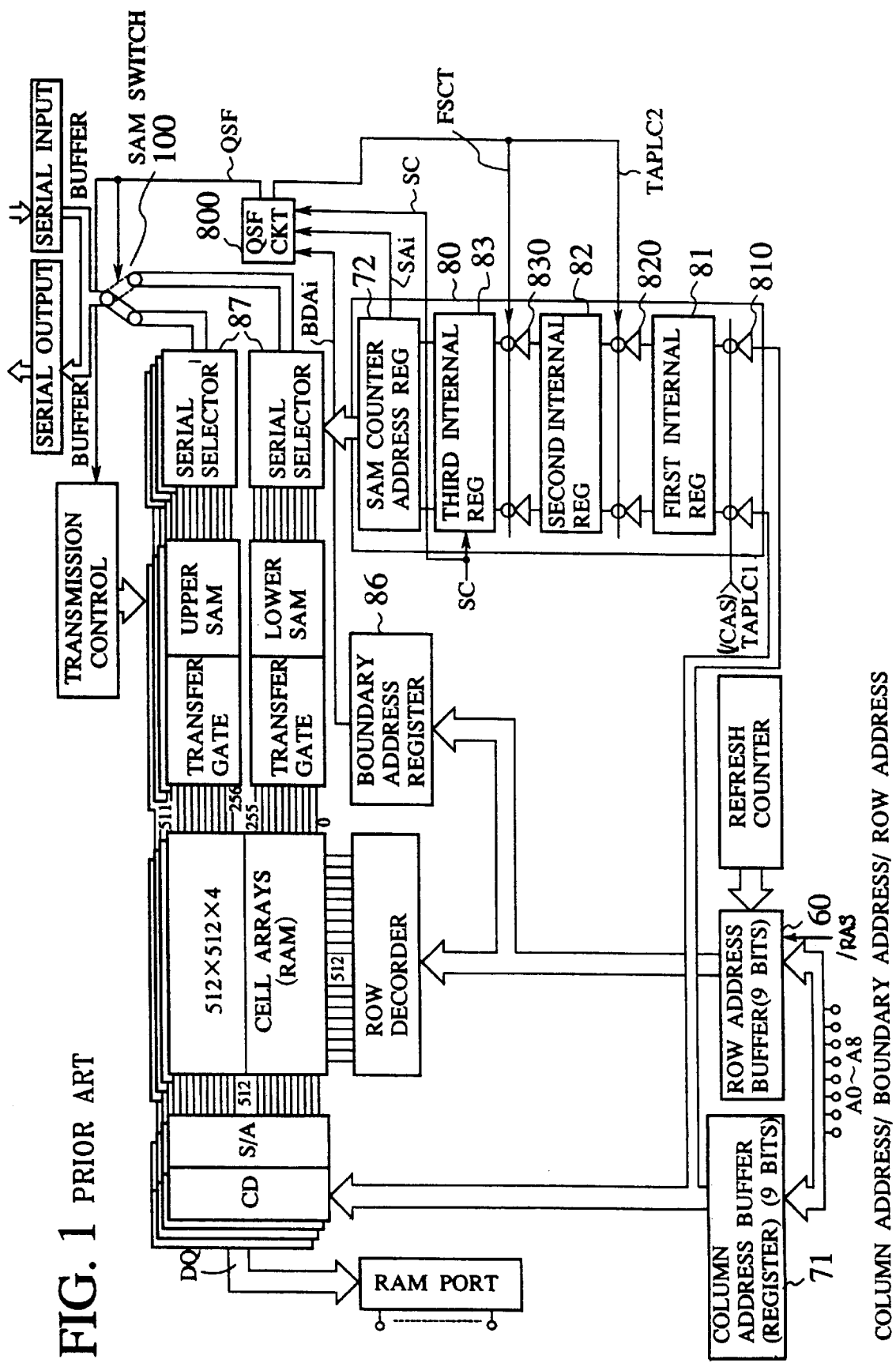
FIG. 1 is a block diagram showing a configuration of a conventional semiconductor memory device.
Figure 2:
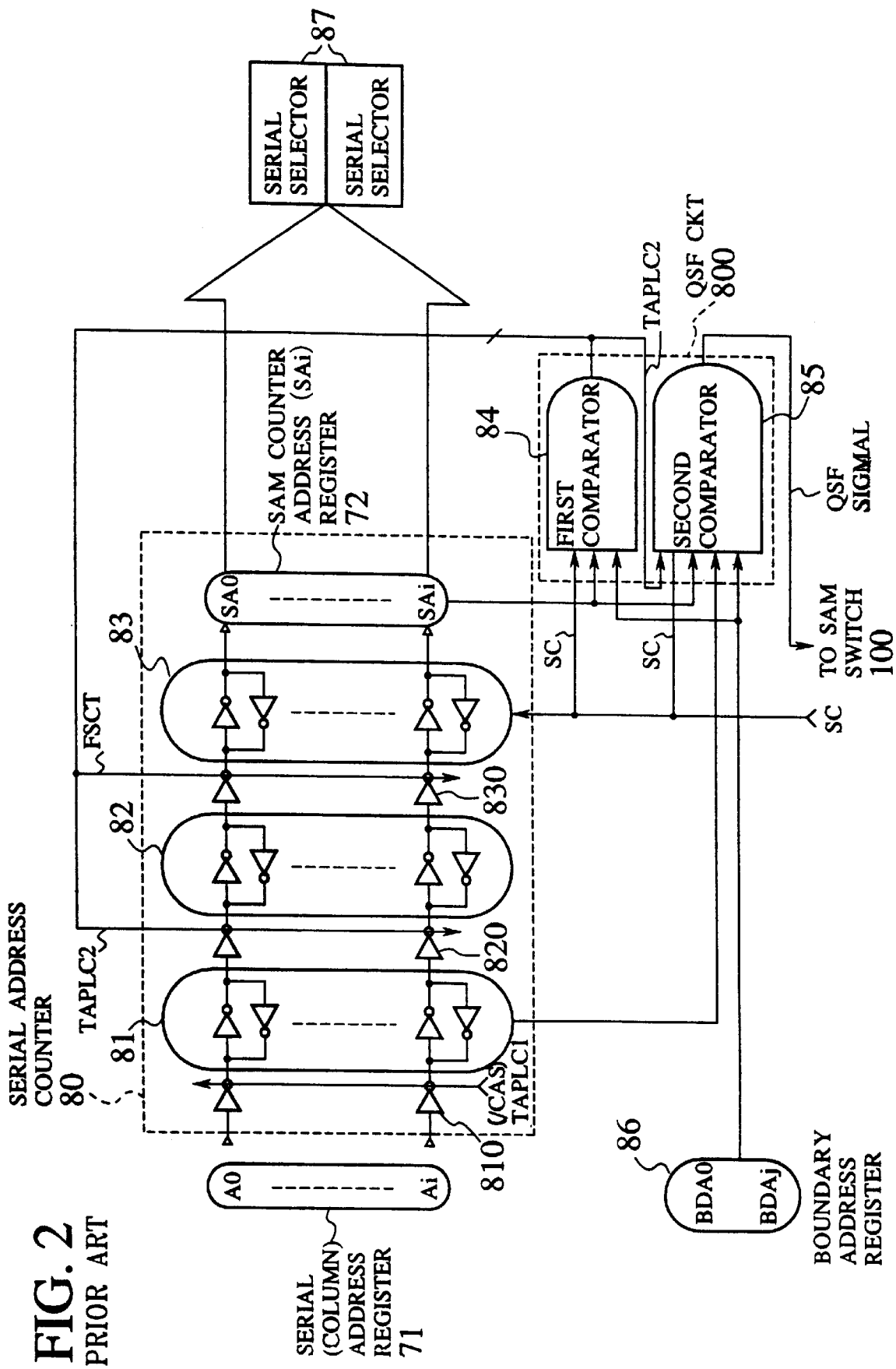
FIG. 2 is a configuration diagram mainly showing a serial address counter 80 incorporated in the dual-port semiconductor memory device shown in FIG. 1.
Figure 4A:
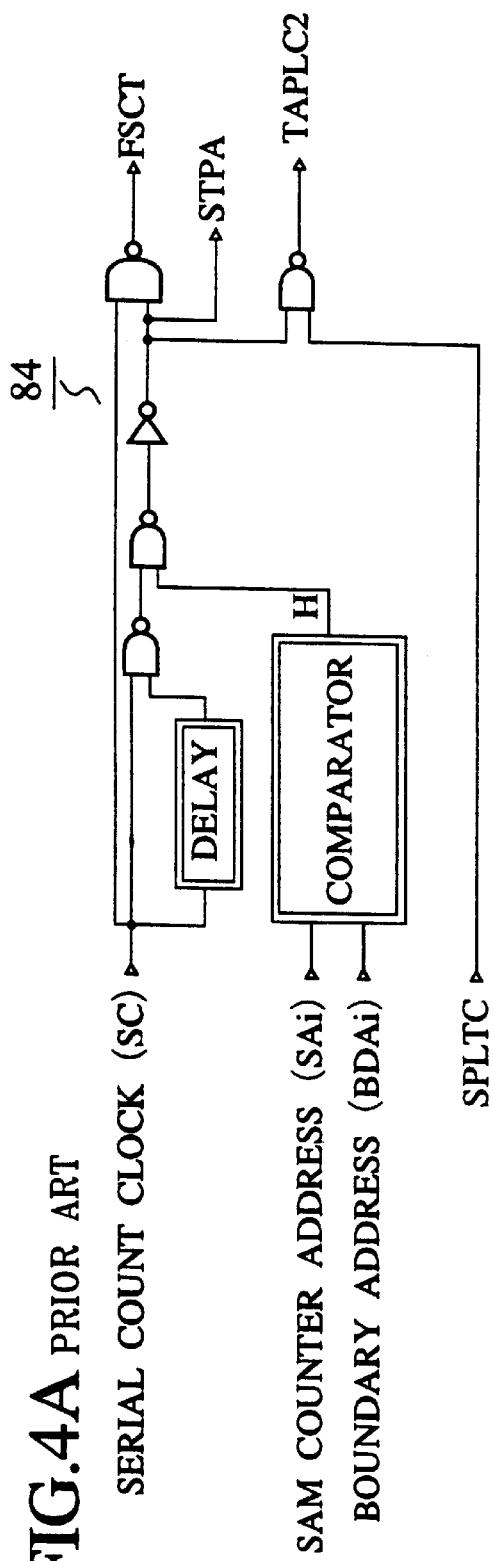
FIGS. 4A and 4B are configuration diagrams for generating control signals used in the conventional split transfer operation.
Figure 4B:
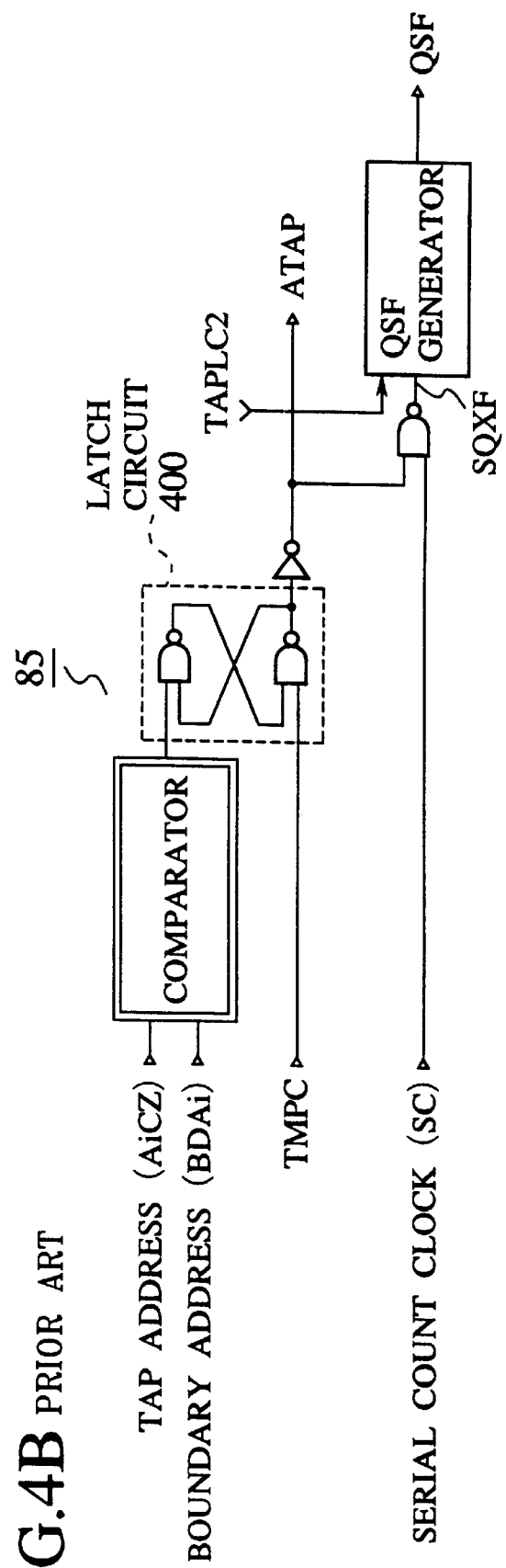

As we have already described in the prior art section, there is the problem under the first SAM composite mode (conventional example 1 shown in FIG. 5) in the conventional dual-port semiconductor memory device shown in FIG. 1.

Figure 5:
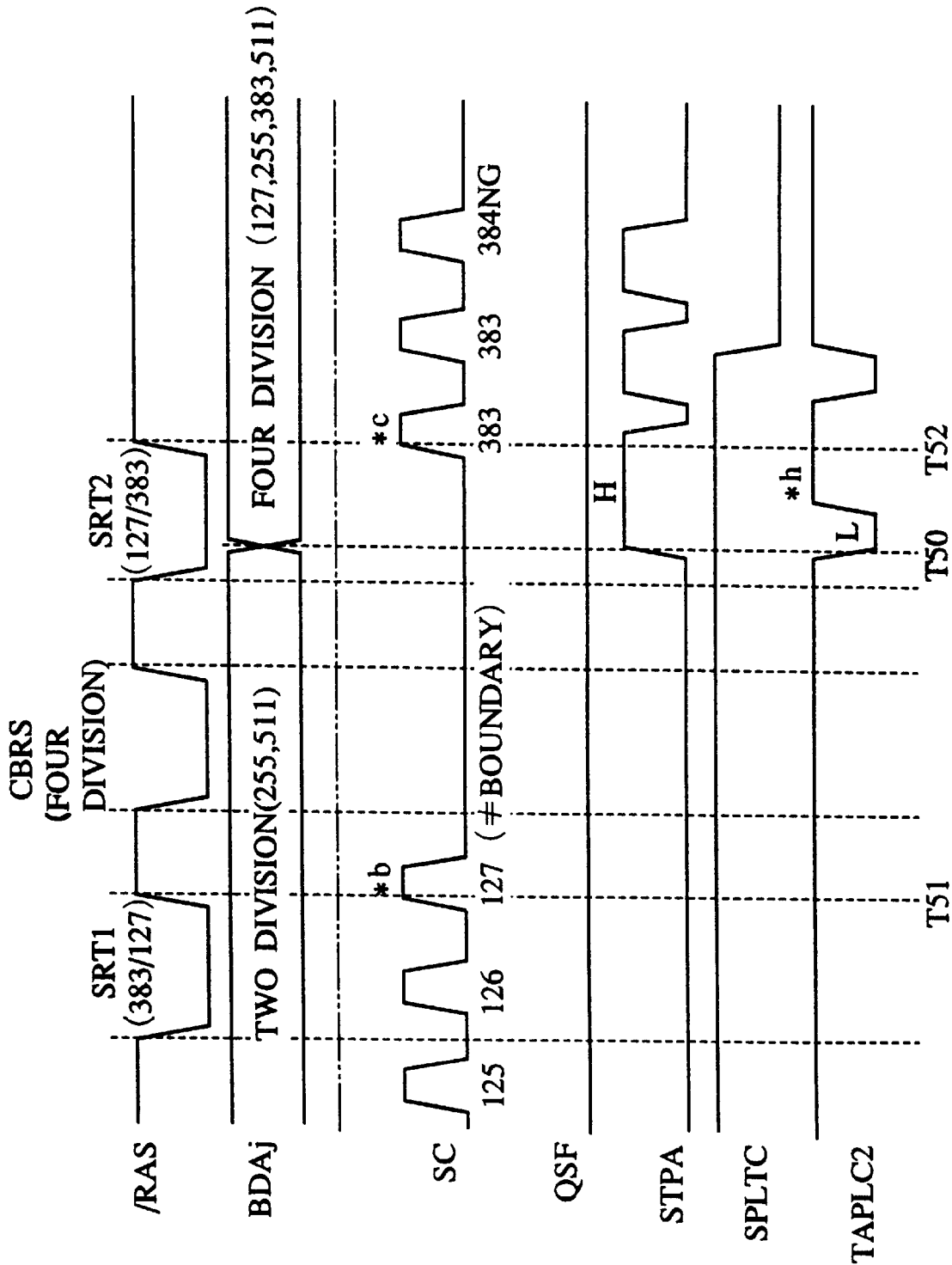
FIG. 5 is a timing chart for a conventional SAM composite mode as a first example.

In the first conventional problem (conventional example 1) shown in FIG. 5, the comparison of a SAM counter address (127) stored in the SAM counter address register 72 and a new boundary address (127) stored in the boundary address register 86 is performed at the timing T50 following a boundary address change and the SAM counter address (127) is regarded as the boundary address (127). In addition, when the next serial clock SC(383) is received, the SAM counter address gives erroneous operation, namely the SAM counter address register 72 receives the new TAP address (383) at the timing T50 shown in FIG. 5 because the low pulse signal of the control signal TAPLC2 is generated, as previously discussed.

As shown in FIG. 11A, the control signal generator 18-1 generates the control signal FINE or the control signal CMP of the high level only when the number of divisions of the boundary address is increased or changed.

As shown in FIG. 11B, the control signal STPA is at the low level while the control signal FINE is at the high level. By this, the control signal STPA is at the low level from the timing T120 to the timing T121.

By executing the CBRS mode, the number of divisions of the boundary address is increased at the timing T120. Although the control signal STPA is changed to the high level only when the SAM counter address agrees with the boundary address, the control signal STPA is at the low level while the control signal FINE is at the high level from the timing T120 and the timing T121.

As a result, as shown in FIG. 12, even if the number of divisions of boundary addresses is occurred in the SRT2 cycle by the CBRS cycle, the first serial clock SC(127) designated by the character reference "*b" following the SRT1 cycle is not regarded as an erroneous boundary address, and the SAM counter address operates correctly.

Figure 13:
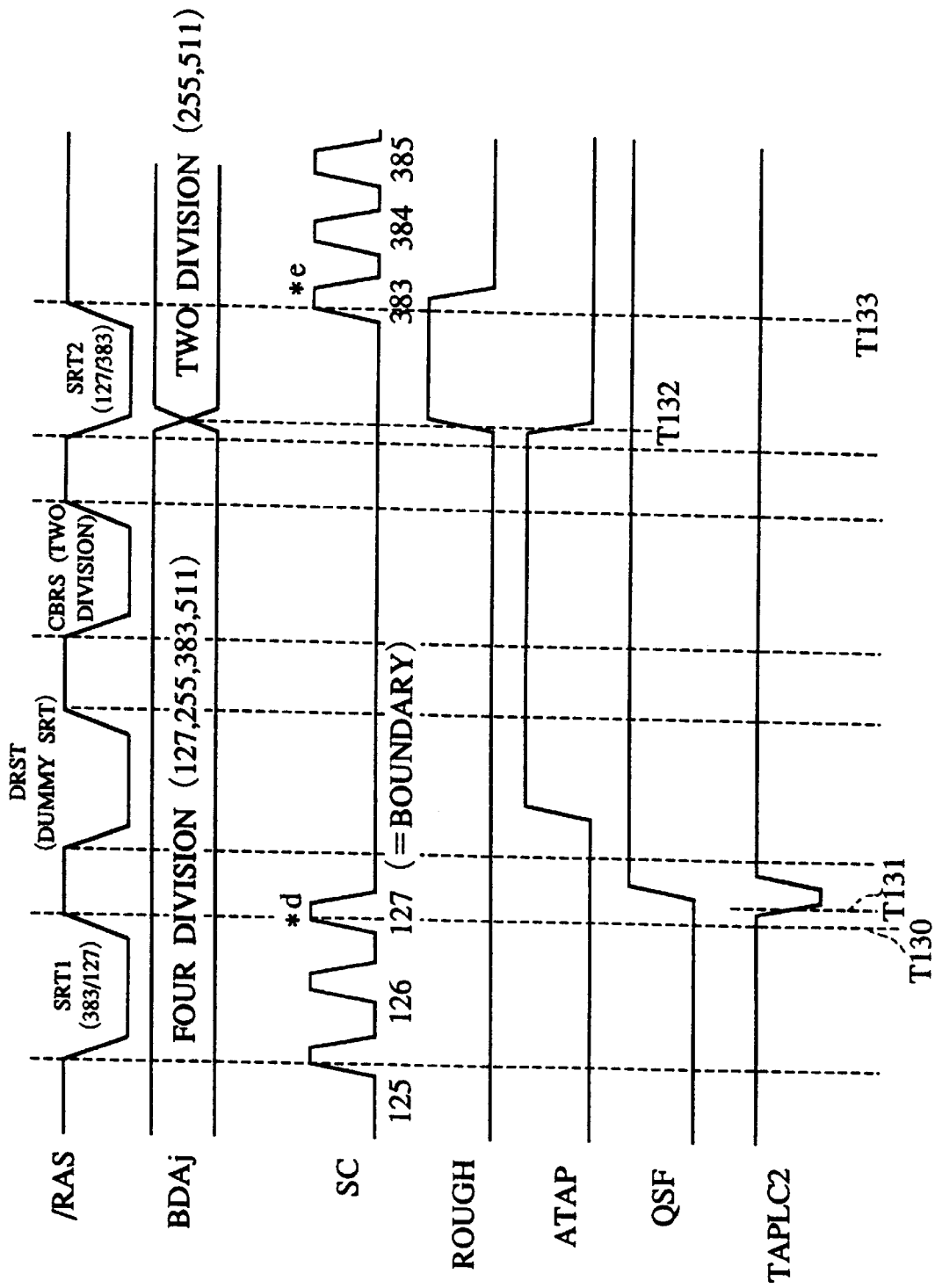
FIG. 13 is a timing chart for a SAM composite mode as a second example in the semiconductor memory device shown in FIG. 8A.

Next, FIG. 13 is a timing chart for a split transfer operation under SAM composite mode (Example 2) of the dual-port semiconductor memory device of the present invention shown in FIG. 8A.

Figure 6:
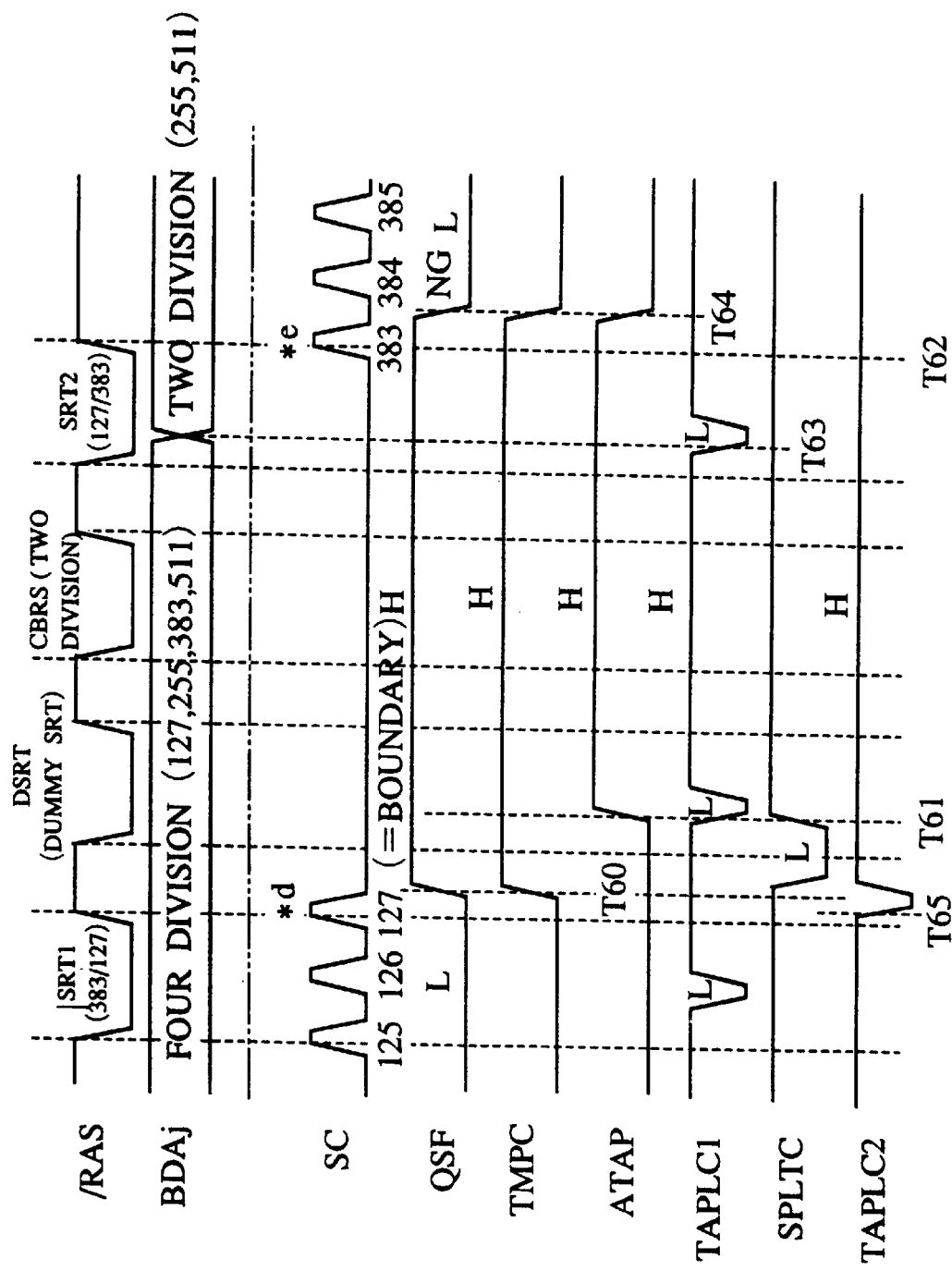
FIG. 6 is a timing chart for a conventional SAM composite mode as a second example.
Figure 7:
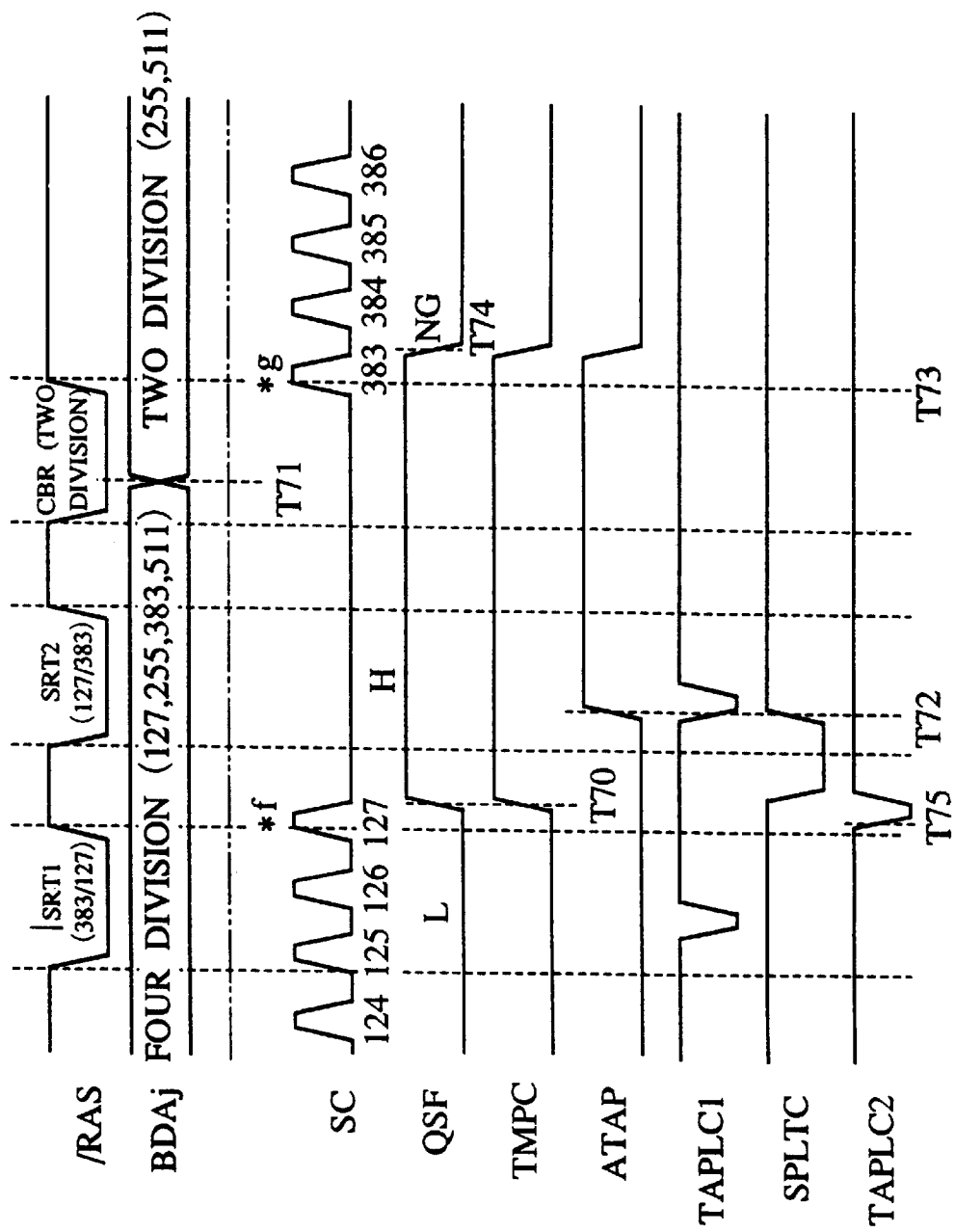
FIG. 7 is a timing chart for a conventional SAM composite mode as a third example.

The problem in this SAM composite mode (conventional Example 2) is that a comparison of a TAP address and a new boundary address in the SRT1 cycle is not performed following a boundary change in the SRT2 cycle before the first SAM clock SC is received at the timing T62 shown in FIG. 6.

Accordingly, the output from the save register 23-2 newly-added shown in FIGS. 9 and 10 acts as follows.

The tap address latched during the SRT1 cycle is transferred into the save register 23-2 at the timing T131 by means of the low pulse of the signal TAPCL2 which is generated only when the SAM counter address SC is equal to the boundary address following the SRT1 cycle (the reference character "*d" shown in FIG. 13). The control signal TAPLC2 is generated at the timing T131 only immediately after the SAM counter address (SAi=127) is agreed with the boundary address (BDAi=127) at the timing T130.

The address stored in the save register 23-2 is held until after the SRT2 cycle so that, as a result, the tap address (127/383) in the SRT2 cycle is stored until after the SRT2 cycle in the second internal register 23.

During the period from the start of the SRT2 cycle immediately after the CBRS cycle in which the number of divisions of boundary addresses (which is the condition under which erroneous operation occurs, is decreased in the rough). Until the first SAM count clock SC (383) designated by the reference character "*e" is received, the control signal ROUGH of the high level is generated. The new TAP address (383) has been already set into the save register 23-2 at the timing T131 because the low pulse signal of the control signal TAPLC2 is generated. When the control signal ROUGH is changed to the high level at the timing T132, by immediately comparing the TAP address (383) in the save register 21 with the new boundary address stored in the boundary address register 17, the tap address (383/127) stored in the save register 23-2 is compared with the boundary address, and the signal ATAP is changed to the low level at the timing T132 because the TAP address in the save register 23-2 is agree with the boundary address in the boundary address register 17.

In the case where the boundary address is not changed (when the control signal ROUGH is at the low level), the first internal address register 25 and the boundary address are compared by the second comparator 28. In this case, a dummy TAP address of the DRST cycle is set in the first internal register 25. For this reason, the control signal ATAP is changed to the low level before the timing T133 prior to receiving of the serial clock SC(383) designated by the reference character "*e", which is the first serial clock SC in the SRT1 cycle, and the control signal QSF operates correctly with no erroneous switching.

Figure 14:
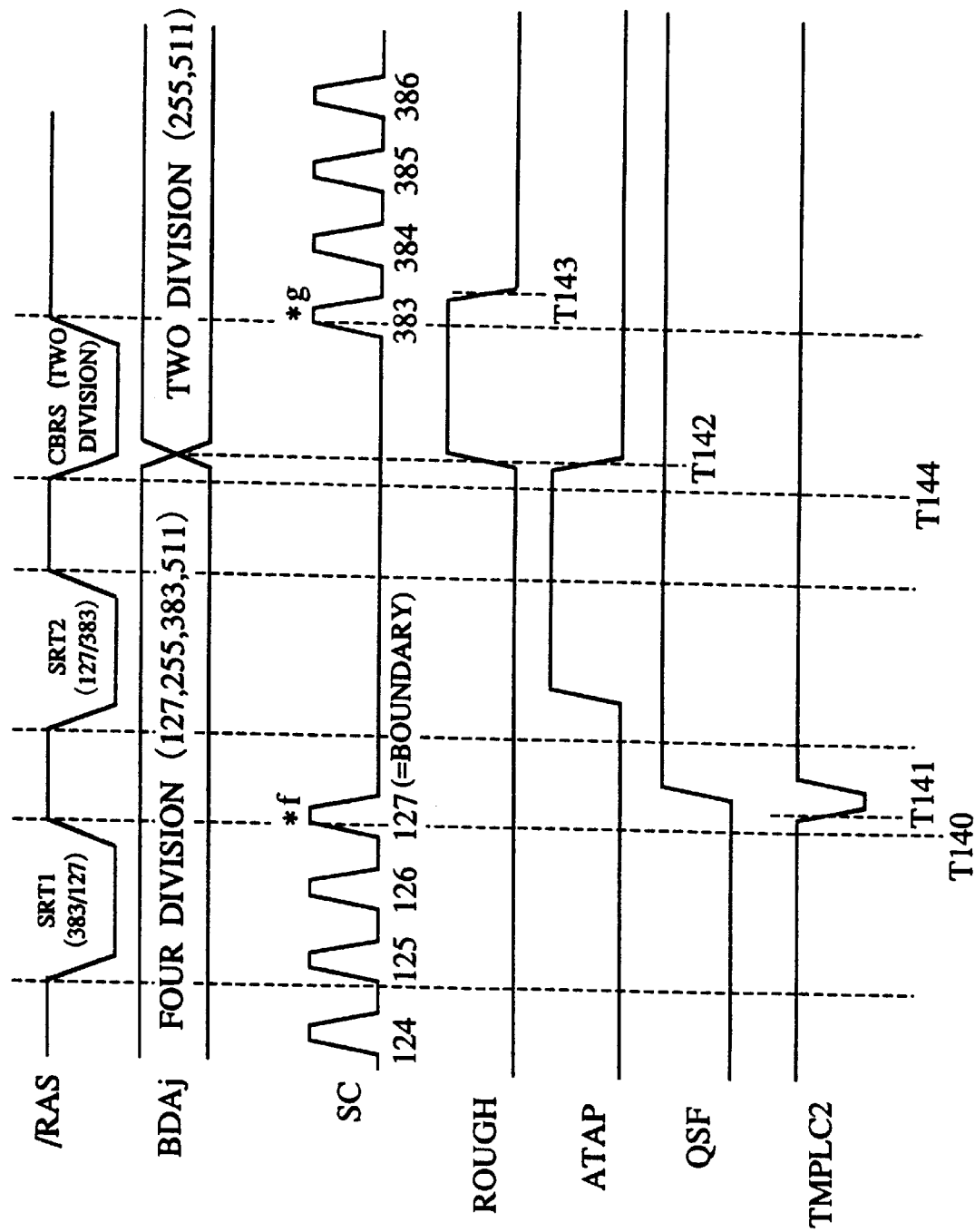
FIG. 14 is a timing chart for a SAM composite mode as a third example in the semiconductor memory device shown in FIG. 8A.

Next, FIG. 14 is a timing chart for a split transfer operation under SAM composite mode (conventional Example 3) of the dual-port semiconductor memory device of the present invention shown in FIG. 8A.

In the same manner as for the second SAM composite mode (Example 2), the problem area in this composite mode is that the TAP address and a new boundary in the SRT1 cycle are not compared following a new boundary address in the CBR cycle.

The tap address latched during the SRT1 (383/127) cycle is transferred into the save register 23-2 at the timing T131 by means of the control signal TAPCL2 which is generated only when the SAM counter address SC is equal to the boundary address following the SRT1 cycle (the reference character "*f" shown in FIG. 14). The control signal TAPLC2 is generated at the timing T141 only immediately after the SAM counter address is agreed with the boundary address at the timing T140.

Accordingly, the control signal ROUGH is at high level from the timing T142 to the timing T143 just when the number of divisions of boundary addresses is decreased in the rough condition in CBR cycle, which is the condition producing erroneous operation, during the interval from the start (at the timing T144) of the CBR cycle until the serial clock SC is received, and by immediately comparing the addresses stored in the save register 23-2 with the new boundary address, the tap address (address stored in the save register 23-2 are 383 and 127) is not regarded as the boundary address, and the control signal ATAP is at low level.

On the other hand, when the boundary address is not changed, the save register 21 and the boundary address are compared. For this reason, the control signal ATAP is at low level prior to the serial clock SC (383) which is the first serial clock SC in the SRT1 mode, and the control signal QSF operates correctly with no erroneous switching.

As outlined in the foregoing, with the above-described embodiment, because the save register 21 has been newly provided, as in the second composite mode (Example 2), by executing the split transfer with the serial clock SC not transferred (Dummy SRT) the tap address for the DSRT cycle is not superscribed in the original internal address register 25 compared with the boundary is stored, so the tap address of the SRT1 cycle can be maintained.

In addition, even if the boundary address is changed during a split transfer mode by the CBRS, CBR cycle, the boundary address and the tap address to be compared can be selected by the provision of the control signal CMP indicating a change of the division of the boundary address, or by the provision of the control signals FINE and ROUGH indicating that the boundary address is roughly divided (decreasing) or finely divided (increasing).

Therefore, the SAM counter address and the signal control signal QSF can be correctly controlled for any combination of split transfer, dummy split transfer, CBRS cycle, CBR cycle or the like.

Also, the dual-port semiconductor memory device as the above-described embodiment was explained for a SAM address of 0 to 511, and a boundary address divided into two parts or into four parts. However, the scope of the present invention is not limited to these conditions.

The above-described embodiment is also explained for a split transfer which is a split-read transfer (RAM to SAM), but a split-write transfer (SAM to RAM) can also be applied in the present invention.

As outlined above, the dual port memory of the present invention can be more easily used as a memory for graphics.

While the above provides a full and complete disclosure of the preferred embodiments of the present invention, various modifications, alternate constructions and equivalents any be employed without departing from the true spirit and scope of the invention. Therefore the above description and illustration should not be constructed as limiting the scope of the invention, which is defined by the appended claims.

What is claimed is:

1. A semiconductor memory device with a function of a split read/write transfer by which data stored in memory cells in a row divided into two parts are transferred alternately, comprising:

a memory cell array having a plurality of dynamic random access memory cells arranged in a matrix, the dynamic random access memory cells divided into a first memory cell part and a second memory cell part;

a serial data register comprising a plurality of registers divided into a first serial data register and a second serial data register, the first serial data register for storing one half of data stored in the memory cells in a row, the second serial data register for storing other half of data stored in the memory cells in the row, wherein a serial data stream of continuous serial data is transferred between the plurality of dynamic random access memory cells and the serial data register;

a serial selector comprising a first serial selector and a second serial selector, the first serial selector connected to the first serial data register, the second serial selector connected to the second serial data register, the first serial selector and the second serial selector for selecting register one from the first serial data register and the second serial data register;

a boundary address register for storing a boundary address;

a first control circuit for receiving the boundary address from the boundary address register, comparing a new boundary address with an old boundary address previously stored in the boundary address register, generating a first level of a first control signal when the new boundary address is different from the old boundary address;

a counter comprising a first counter register, a second counter register, and a third counter register, the first counter register receiving a TAP address and storing the TAP address, the second counter register receiving the TAP address from the first counter register and storing the TAP address, and the third counter register receiving the TAP address from the second counter register and generating a current address obtained by incrementing the TAP address in response to a serial clock and transferring the current address to the serial selector;

a second control circuit for comparing the current address stored in the third counter register with the boundary address stored in the boundary address register only when the first control signal is other than the first level, generating a first level of a second control signal when the current address stored in the third counter register agrees with the boundary address register, and generating a first level of a third control signal when the third counter register receives a first serial clock after the current address stored in the third counter register agrees with the boundary address during the split read/write transfer; and a third control circuit for comparing the TAP address stored in the first counter register with the boundary address, and generating a fourth control signal for selecting one of the first serial data register and the second serial data register alternately when the TAP address stored in the first counter register agrees with the boundary address stored in the boundary address register, wherein the second counter register receives the TAP address stored in the first counter register only when receiving the first level of the second control signal from the second control circuit, and the third counter register receives the TAP address stored in the second counter register only when receiving the first level of the third control signal.

2. A semiconductor memory device as claimed in claim 1, wherein the first counter register, the second counter register, and the third counter register each comprises a plurality of flip/flops.

3. A semiconductor memory device as claimed in claim 1, wherein the memory cell array further comprises:

a plurality of word lines;

a plurality of bit lines;

a plurality of transfer gates provided to each of the plurality of bit lines to connect each dynamic access random memory cell to each of the plurality of bit lines;

a sense amplifier connected to each of the plurality of bit lines for sensing data to be written into each of the plurality of random access memory cells or for sensing data to be read out from each of the plurality of random access memory cells; and an equalizer provided for the sense amplifier for equalizing a voltage potential of each of the plurality of bit lines.

4. A semiconductor memory device with a finction of a split read/write transfer by which data stored in memory cells in a row divided into two parts are transferred alternately, comprising:

a dynamic random access memory array having a plurality of dynamic random access memory cells arranged in a matrix, the dynamic random access memory cells divided into a first memory cell part and a second memory cell part;

a serial data register comprising a plurality of registers divided into a first serial data register and a second serial data register, the first serial data register for storing one half of data stored in the memory cells in a row, the second serial data register for storing other half of data stored in the memory cells in the row, wherein a serial data stream of continuous serial data is transferred between the plurality of dynamic random access memory cells and the serial data register;

a serial selector comprising a first serial selector and a second serial selector, the first serial selector connected to the first serial data register, the second serial selector connected to the second serial data register, the first serial selector and the second serial selector for selecting one register from the first serial data register and the second serial data register;

a boundary address register for storing boundary addresses;

a first control circuit for receiving the boundary address from the boundary address register, the first control circuit:
  comparing a number of new boundary addresses with a number of old boundary addresses previously stored in the boundary address register,
  generating a first level of a fifth control signal when the number of new boundary addresses is greater than the number of old boundary addresses,
  generating a first level of a sixth control signal when the number of new boundary addresses is smaller than the number of old boundary addresses, and
  generating a second level of the sixth control signal when the number of new boundary addresses is not smaller than the number of old boundary addresses;

a counter comprising a first counter register, a second counter register, a third counter register, and a fourth counter register, the first counter register receiving a TAP address and storing the TAP address, the second counter register and the fourth counter register receiving the TAP address from the first counter register and storing the TAP address, and the third counter register receiving the TAP address from the second counter register and generating a current address obtained by incrementing the TAP address in response to a serial clock and transferring the current address to the serial selector;

a second control circuit for comparing the current address stored in the third counter register with the boundary address stored in the boundary address register only when the fifth control signal is other than the first level, generating a first level of a second control signal when the current address stored in the third counter register agrees with the boundary address stored in the boundary address register, and
  generating a first level of a third control signal during the split read/write transfer when the third counter register receives a first serial clock after the current address stored in the third counter register agrees with the boundary address; and a third control circuit for generating a fourth control signal for selecting one of the first serial data register and the second serial data register alternately
  when the TAP address stored in the first counter register agrees with the boundary address stored in the boundary address register on receiving the second level of the sixth control signal from the first control circuit, and
  when the TAP address stored in the fourth counter register agrees with the boundary address stored in the boundary address register on receiving the first level of the sixth control signal from the first control circuit, wherein the second counter register and the fourth counter register receive the TAP address stored in the first counter register only when receiving the first level of the second control signal from the second control circuit, and the third counter register receives the TAP address stored in the second counter register only when receiving the first level of the third control signal.

5. A semiconductor memory device as claimed in claim 4, wherein the first counter register, the second counter register, the third counter register, and the fourth counter register each comprises a plurality of flip/flops, and the second counter register and the fourth counter register are connected in parallel.

6. A semiconductor memory device as claimed in claim 4, wherein the memory cell array further comprises:
  a plurality of word lines;
  a plurality of bit lines;
  a plurality of transfer gates provided to each of the plurality of bit lines to connect each dynamic access random memory cell to each of the plurality of bit lines;
  a sense amplifier connected to each of the plurality of bit lines for sensing data to be written into each of the plurality of random access memory cells or for sensing data to be read out from each of the plurality of random access memory cells; and
  an equalizer provided for the sense amplifier for equalizing a voltage potential of each of the plurality of bit lines.

7. A semiconductor memory device with a function of a split read/write transfer by which data stored in memory cells in a row divided into two parts are transferred alternately, comprising;
  a dynamic random access memory array having a plurality of dynamic random access memory cells arranged in a matrix, the dynamic random access memory cells divided into a plurality of memory cell parts;
  a serial data register comprising a plurality of registers divided into a plurality of serial data register parts, each serial data register part storing a part of data stored in the memory cells in a row;
  a transfer gate comprising a plurality of individual transfer gates located between the plurality of memory cell parts and the plurality of serial data register parts;
  a serial selector comprising a plurality of individual serial selectors connected to the plurality of serial data register parts, for selecting registers in the plurality of serial data register parts;
  a boundary address register for storing a boundary address;
  a first control circuit for receiving the boundary address from the boundary address register, comparing a new boundary address and an old boundary address previously stored in the boundary address register, generating a first level of a first control signal when the new boundary address is different from the old boundary address;
  a counter comprising a first counter register, a second counter register, and a third counter register, the first counter register receiving a TAP address and storing the TAP address, the second counter register receiving the TAP address from the first counter register and storing the TAP address, and the third counter register receiving the TAP address from the second counter register and generating a current address obtained by incrementing the TAP address when receiving a serial clock and transferring the current address to the serial selector;

a second control circuit for comparing the current address stored in the third counter register with the boundary address stored in the boundary address register only when not receiving the first level of the first control signal,
generating a first level of a second control signal when the current address stored in the third counter register being agree with the boundary address stored in the boundary address register, and
generating a first level of a third control signal during the split read/write transfer when the third counter register receives a first serial clock after the current address stored in the third counter register being agree with the boundary address; and a third control circuit for comparing the TAP address stored in the first counter register with the boundary address, and generating a fourth control signal for selecting one serial data register of the plurality of serial data register parts alternately when the TAP address stored in the first counter register agrees with the boundary address stored in the boundary address register, wherein the second counter register receives the TAP address stored in the first counter register only when receiving the first level of the second control signal from the second control circuit, and the third counter register receives the TAP address stored in the second counter register only when receiving the first level of the third control signal.

8. A semiconductor memory device with a function of a split read/write transfer by which data stored in memory cells in a row divided into two parts are transferred alternately, comprising:

a dynamic random access memory array having a plurality of dynamic random access memory cells arranged in a matrix, the dynamic random access memory cells divided into a plurality of memory cell parts;

a serial data register comprising a plurality of registers divided into a plurality of serial data register parts, each serial data register part storing a part of data stored in the memory cells in a row;

a transfer gate comprising a plurality of individual transfer gates located between the plurality of memory cell parts and the plurality of serial data register parts;

a serial selector comprising a plurality of individual serial selectors connected to the plurality of serial data register parts, for selecting registers in the plurality of serial data register parts;

a boundary address register for stores boundary addresses;

a first control circuit for receiving a boundary address from the boundary address register, the first control circuit:

comparing a number of new boundary addresses with a number of old boundary addresses previously stored in the boundary address register, generating a first level of a fifth control signal when the number of new boundary addresses is greater than the number of old boundary addresses, generating a first level of a sixth control signal when the number of new boundary addresses is smaller than the number of old boundary addresses, and generating a second level of the sixth control signal when the number of new boundary addresses is not smaller than the number of old boundary addresses;

a counter comprising a first counter register, a second counter register, a third counter register, and a fourth counter register, the first counter register receiving a TAP address and storing the TAP address, the second counter register and the fourth counter register receiving the TAP address from the first counter register and storing the TAP address, and the third counter register receiving the TAP address from the second counter register and generating a current address obtained by incrementing the TAP address on receiving a serial clock and transferring the current address to the serial selector;

a second control circuit for comparing the current address stored in the third counter register with the boundary address stored in the boundary address register only when the fifth control signal is other than the first level, generating a first level of a second control signal when the current address stored in the third counter register agrees with the boundary address stored in the boundary address register, and generating a first level of a third control signal during the split read/write transfer when the third counter register receives a first serial clock after the current address stored in the third counter register agrees with the boundary address; and a third control circuit for generating a fourth control signal for selecting one serial data register part of the plurality of serial data register parts when the TAP address stored in the first counter register agrees with the boundary address stored in the boundary address register on receiving the second level of the sixth control signal from the first control circuit, and when the tap address stored in the fourth counter register agrees with the boundary address stored in the boundary address register on receiving the first level of the sixth control signal from the first control circuit, wherein the second counter register and the fourth counter register receive the TAP address stored in the first counter register only when receiving the first level of the second control signal from the second control circuit, and the third counter register receives the TAP address stored in the second counter register only when receiving the first level of the third control signal.

* * * * *